(12) United States Patent
Liu et al.

(10) Patent No.: US 11,764,232 B2
(45) Date of Patent: Sep. 19, 2023

(54) DISPLAY SUBSTRATE, PREPARATION METHOD AND DRIVING METHOD THEREFOR, AND DISPLAY APPARATUS

(71) Applicants: Ordos Yuansheng Optoelectronics Co., Ltd., Inner Mongolia (CN); BOE Technology Group Co., Ltd., Beijing (CN)

(72) Inventors: Peng Liu, Beijing (CN); Jingyi Xu, Beijing (CN); Hong Liu, Beijing (CN); Peirong Huo, Beijing (CN); Yongqiang Zhang, Beijing (CN)

(73) Assignees: Ordos Yuansheng Optoelectronics Co., Ltd., Inner Mongolia (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/642,957

(22) PCT Filed: May 13, 2021

(86) PCT No.: PCT/CN2021/093676
§ 371 (c)(1),
(2) Date: Mar. 15, 2022

(87) PCT Pub. No.: WO2021/254053
PCT Pub. Date: Dec. 23, 2021

(65) Prior Publication Data
US 2022/0415933 A1    Dec. 29, 2022

(30) Foreign Application Priority Data
Jun. 17, 2020 (CN) .......................... 202010553328.1

(51) Int. Cl.
G06F 3/045 (2006.01)
H01L 27/12 (2006.01)
G09G 3/20 (2006.01)

(52) U.S. Cl.
CPC .......... H01L 27/1274 (2013.01); G09G 3/20 (2013.01); H01L 27/124 (2013.01); H01L 27/1222 (2013.01); G09G 2300/0426 (2013.01)

(58) Field of Classification Search
CPC .................... G02F 1/1368; G09G 2300/0426; G09G 3/20; H01L 27/1222; H01L 27/124; H01L 27/1274
See application file for complete search history.

(56) References Cited

U.S. PATENT DOCUMENTS

2015/0206905 A1   7/2015  Wang
2018/0047764 A1   2/2018  Deng
(Continued)

FOREIGN PATENT DOCUMENTS

CN    101170076 A    4/2008
CN    102184968 A    9/2011
(Continued)

OTHER PUBLICATIONS

International Search Report for PCT/CN2021/093676 dated Aug. 16, 2021.
(Continued)

*Primary Examiner* — Insa Sadio
(74) *Attorney, Agent, or Firm* — Ling Wu; Stephen Yang; Ling and Yang Intellectual Property

(57) ABSTRACT

A display substrate, a preparation method and driving method therefor, and a display apparatus. The display substrate includes a substrate and a switch structure arranged on the substrate, the switch structure being electrically con-
(Continued)

nected to a control signal terminal, a signal input terminal and a signal output terminal. The switch structure comprises a switching unit. The switching unit comprises a first transistor and a second transistor; and the types of the first transistor and the second transistor are opposite. The first transistor comprises: a first active layer, a first gate electrode, a first source electrode, and a first drain electrode. The second transistor comprises: a second active layer, a second gate electrode, a second source electrode, and a second drain electrode.

20 Claims, 10 Drawing Sheets

(56) References Cited

U.S. PATENT DOCUMENTS

| | | | |
|---|---|---|---|
| 2018/0158845 A1 | 6/2018 | Liao et al. | |
| 2018/0181247 A1* | 6/2018 | Yang | G06F 3/04144 |
| 2018/0211984 A1 | 7/2018 | Zeng | |
| 2018/0224683 A1 | 8/2018 | Liu | |
| 2020/0104008 A1 | 4/2020 | Yan | |
| 2020/0410199 A1* | 12/2020 | Lian | H01L 27/1214 |

FOREIGN PATENT DOCUMENTS

| | | |
|---|---|---|
| CN | 106252362 A | 12/2016 |
| CN | 106409845 A | 2/2017 |
| CN | 107154407 A | 9/2017 |
| CN | 111092077 A | 5/2020 |
| CN | 111668237 A | 9/2020 |

OTHER PUBLICATIONS

Office Action dated Mar. 30, 2023 for Chinese Patent Application No. 202010553328.1 and English Translation.

* cited by examiner

DISPLAY SUBSTRATE, PREPARATION METHOD AND DRIVING METHOD THEREFOR, AND DISPLAY APPARATUS

CROSS-REFERENCE TO RELATED APPLICATIONS

The present application is a U.S. National Phase Entry of International Application No. PCT/CN2021/093676 having an international filing date of May 13, 2021, which claims priority of Chinese Patent Application No. 202010553328.1, filed to the CNIPA on Jun. 17, 2020 and entitled "Display Substrate, Preparation Method and Driving Method therefor, and Display Apparatus". The above-identified applications are hereby incorporated by reference.

TECHNICAL FIELD

Embodiments of the present disclosure relate to, but are not limited to, the field of display technologies, and in particular to a display substrate, a preparation method and a driving method therefor, and a display apparatus.

BACKGROUND

In recent years, flat panel displays, such as Thin Film Transistor-Liquid Crystal Displays (TFT-LCDs) and Active Matrix Organic Light Emitting Diodes (AMOLEDs), have been widely used in TV, mobile phone, and other electronic products because of their light weight, thin thickness, and low power consumption.

With development of display technologies, a display product driven at a high frequency has become a development trend. However, high-frequency driving of the display product will lead to a reduction in charging time of each row of pixels in the display product, which will reduce a charging rate of the display product and affect a display effect of the display product.

SUMMARY

The following is a summary of subject matter described in detail herein. This summary is not intended to limit the protection scope of the claims.

In one aspect, an embodiment of the present disclosure provides a display substrate, including: a substrate and a switch structure disposed on the substrate, wherein the switch structure is electrically connected with a control signal terminal, a signal input terminal, and a signal output terminal, and is configured to provide a signal of the signal input terminal to the signal output terminal under control of the control signal terminal; the switch structure includes: a switch unit; the switch unit includes a first transistor and a second transistor; the first transistor and the second transistor are of opposite types; the first transistor includes: a first active layer, a first gate electrode, a first source electrode, and a first drain electrode, the second transistor includes a second active layer, a second gate electrode, a second source electrode, and a second drain electrode; the first gate electrode and the second gate electrode are electrically connected with the control signal terminal, the first source electrode and the second source electrode are electrically connected with the signal input terminal, and the first drain electrode and the second drain electrode are electrically connected with the signal output terminal; and an orthographic projection of the first active layer on the substrate coincides with an orthographic projection of the second active layer on the substrate.

In some possible implementations, the number of switch units is N; a first source electrode of a first switch unit is electrically connected with the signal input terminal, a first drain electrode of a j-th switch unit is electrically connected with a first source electrode of a (j+1)-th switch unit, and a first drain electrode of an N-th switch unit is electrically connected with the signal output terminal; and first and second gate electrodes of all switch units are electrically connected with the control signal terminal, $N \geq 1$, $1 < j < N$.

In some possible implementations, the display substrate further includes a scanning signal line, a data signal line, a common electrode, and a pixel electrode which are disposed on the substrate; the scanning signal line is electrically connected with the control signal terminal and configured to provide a signal to the control signal terminal; the data signal line is connected with the signal input terminal and configured to provide a signal to the signal input terminal; the signal output terminal is connected with the pixel electrode and configured to provide a signal to the pixel electrode; the common electrode is located at a side of the pixel electrode close to the substrate, and is configured to form an electric field with the pixel electrode.

In some possible implementations, the first gate electrode and the second gate electrode are configured as a same electrode; the first active layer is located at a side of the first gate electrode close to the substrate; the second active layer is located at a side of the first gate electrode away from the substrate; and the second active layer is connected with the first active layer.

In some possible implementations, when the first transistor is an N-type transistor and the second transistor is a P-type transistor, the first active layer includes: a first channel region, a first doped region, a second doped region, a third doped region, and a fourth doped region which are arranged along a direction perpendicular to an arrangement direction of the first active layer and the second active layer; the first doped region and the second doped region have a same doping type and are respectively located at both sides of the first channel region; the third doped region and the fourth doped region have a same doping type, the third doped region is located at a side of the first doped region away from the first channel region, and the fourth doped region is located at a side of the second doped region away from the first channel region; a dopant concentration of the third doped region is greater than a dopant concentration of the first doped region; the second active layer includes a second channel region, a fifth dope region, and a sixth doped region which are arranged along a direction perpendicular to an arrangement direction of the first active layer and the second active layer; and the fifth doped region and the sixth doped region have a same doping type and are located at both sides of the second channel region, respectively.

In some possible implementations, when the number of switch units is one, in the switch unit, the second source electrode and the second drain electrode are disposed at a side of the second active layer away from the substrate; the second source electrode is electrically connected with the third doped region through the fifth doped region, and the second source electrode and the fifth doped region are multiplexed into a first source electrode; the second drain electrode is electrically connected with the fourth doped region through the sixth doped region, and the second drain electrode and the sixth doped region are multiplexed into a first drain electrode; when the number of switch units is at least two, in each switch unit, the second source electrode and the second drain electrode are disposed at a side of the second active layer away from the substrate; the second source electrode is electrically connected with the third doped region through the fifth doped region, and the second source electrode and the fifth doped region are multiplexed into a first source electrode; the second drain electrode is electrically connected with the fourth doped region through the sixth doped region, and the second drain electrode and the sixth doped region are multiplexed into a first drain electrode; a second drain electrode of an i-th switch unit and a second source electrode of an (i+1)-th switch unit are a same electrode, $1 \leq i < N$; or, when the number of switch units is at least two, a second source electrode of a first switch unit is disposed at a side of a second active layer of the first switch unit away from the substrate, and a second drain electrode of a last switch unit is disposed at a side of a second active layer of the last switch unit away from the substrate; in the first switch unit, the second source electrode is electrically connected with the third doped region through the fifth doped region, and the second source electrode and the fifth doped region are multiplexed into a first source electrode; the sixth doped region is multiplexed into a second drain electrode, and the fourth doped region is multiplexed into a first drain electrode; in a j-th switch unit, the fifth doped region is multiplexed into a second source electrode, the third doped region is multiplexed into a first source electrode, the sixth doped region multiplexed into a second drain electrode, and the fourth doped region multiplexed into a first drain electrode, $1 < j < N$; a sixth doped region of a (j−1)-th switch unit and the fifth doped region of the j-th switch unit are a same doped region, and a fourth doped region of the (j−1)-th switch unit and the third doped region of the j-th switch unit are a same doped region; in the last switch unit, the fifth doped region is multiplexed into a second source electrode, the third doped region is multiplexed into a first source electrode, the second drain electrode is electrically connected with the fourth doped region through the sixth doped region, and the second drain electrode and the sixth doped region are multiplexed into a first drain electrode.

In some possible implementations, when the first transistor is a P-type transistor and the second transistor is an N-type transistor, the first active layer includes a first channel region, a first doped region, and a second doped region which are arranged along a direction perpendicular to an arrangement direction of the first active layer and the second active layer; the first doped region and the second doped region have a same doping type and are respectively located at both sides of the first channel region; the second active layer includes a second channel region, a third dope region, a fourth doped region, a fifth doped region and a sixth doped region which are arrange along the direction perpendicular to the arrangement direction of the first active layer and the second active layer; the third doped region and the fourth doped region have a same doping type and are located at both sides of the second channel region respectively; the fifth doped region and the sixth doped region have a same doping type, the fifth doped region is located at a side of the third doped region away from the second channel region, and the sixth doped region is located at a side of the fourth doped region away from the second channel region; and a dopant concentration of the fifth doped region is greater than a dopant concentration of the third doped region.

In some possible implementations, when the number of switch units is one, in the switch unit, the second source electrode and the second drain electrode are disposed at a side of the second active layer away from the substrate; the second source electrode is electrically connected with the first doped region through the fifth doped region, and the second source electrode and the fifth doped region are multiplexed into a first source electrode; the second drain electrode is electrically connected with the second doped region through the sixth doped region, and the second drain electrode and the sixth doped region are multiplexed into a first drain electrode; when the number of switch units is at least two, in each switch unit, the second source electrode and the second drain electrode are disposed at a side of the second active layer away from the substrate; the second source electrode is electrically connected with the first doped region through the fifth doped region, and the second source electrode and the fifth doped region are multiplexed into a first source electrode; the second drain electrode is electrically connected with the second doped region through the sixth doped region, and the second drain electrode and the sixth doped region are multiplexed into a first drain electrode; a second drain electrode of an i-th switch unit and a second source electrode of an (i+1)-th switch unit are a same electrode, $1 \leq i < N$; or, when the number of switch units is at least two, a second source electrode of a first switch unit is disposed at a side of a second active layer of the first switch unit away from the substrate, and a second drain electrode of a last switch unit is disposed at a side of a second active layer of the last switch unit away from the substrate; in the first switch unit, the second source electrode is electrically connected with the first doped region through the fifth doped region, and the second source electrode and the fifth doped region are multiplexed into a first source electrode; the sixth doped region is multiplexed into a second drain electrode, and the second doped region is multiplexed into a first drain electrode; in a j-th switch unit, the fifth doped region is multiplexed into a second source electrode, the first doped region is multiplexed into a first source electrode, the sixth doped region multiplexed into a second drain electrode, and the second doped region is multiplexed into a first drain electrode, $1 < j < N$; a sixth doped region of a (j−1)-th switch unit and the fifth doped region of the j-th switch unit are a same doped region, and a second doped region of the (j−1)-th switch unit and the first doped region of the j-th switch unit are a same doped region; in the last switch unit, the fifth doped region is multiplexed into a second source electrode, the first doped region is multiplexed into a first source electrode, the second drain electrode is electrically connected with the second doped region through the sixth doped region, and the second drain electrode and the sixth doped region are multiplexed into a first drain electrode.

In some possible implementations, an orthographic projection of the first channel region on the substrate coincides with an orthographic projection of the second channel region on the substrate; and the orthographic projection of the first channel region on the substrate at least partially overlaps with an orthographic projection of the first gate electrode on the substrate.

In some possible implementations, the display substrate further includes a shading layer; the shading layer is located at a side of the first active layer close to the substrate, and an orthographic projection of the shading layer on the substrate covers the orthographic projection of the first channel region on the substrate.

In some possible implementations, the display substrate includes a first metal layer, a first insulating layer, a first polysilicon layer, a second insulating layer, a second metal layer, a third insulating layer, a second polysilicon layer, a fourth insulating layer, and a third metal layer, which are sequentially arranged along a direction perpendicular to the substrate; and the first metal layer includes a shading layer, the first polysilicon layer includes a first active layer, the second metal layer includes a first gate electrode and a scanning signal line, the second polysilicon layer includes a second active layer, and the third metal layer includes a second source electrode, a second drain electrode, and a data signal line.

In some possible implementations, the display substrate further includes a planarization layer, a first transparent conductive layer, a fifth insulating layer, and a second transparent conductive layer; the planarization layer is located at a side of the third metal layer away from the substrate, and the planarization layer is disposed with a first via exposing the second drain electrode; the first transparent conductive layer is located at a side of the planarization layer away from the substrate, and the first transparent conductive layer is disposed with a second via exposing the first via; an orthographic projection of the second via on the substrate covers an orthographic projection of the first via on the substrate; and the first transparent conductive layer includes: a common electrode; the fifth insulating layer is located at a side of the first transparent conductive layer away from the substrate, and the fifth insulating layer is disposed with a third via exposing the second via; the second transparent conductive layer is located at a side of the fifth insulating layer away from the substrate, and includes: a pixel electrode connected with the second drain electrode through the first via, the second via, and the third via.

In a second aspect, an embodiment of the present disclosure further provides a display apparatus including the display substrate described above.

In a third aspect, an embodiment of the present disclosure further provides a preparation method of a display substrate, configured to form the display substrate described above. The method includes: providing a substrate; and forming a switch structure on the substrate; the switch structure is electrically connected with a control signal terminal, a signal input terminal, and a signal output terminal respectively and is configured to provide a signal of the signal input terminal to the signal output terminal under control of the control signal terminal; the switch structure includes: a switch unit; the switch unit includes a first transistor and a second transistor; the first transistor and the second transistor are of opposite types; the first transistor includes a first active layer, a first gate electrode, a first source electrode, and a first drain electrode, and the second transistor includes a second active layer, a second gate electrode, a second source electrode, and a second drain electrode; the first gate electrode and the second gate electrode are respectively electrically connected with the control signal terminal, the first source electrode and the second source electrode are respectively electrically connected with the signal input terminal, and the first drain electrode and the second drain electrode are respectively electrically connected with the signal output terminal; and an orthographic projection of the first active layer on the substrate coincides with an orthographic projection of the second active layer on the substrate.

In some possible implementations, the forming the switch structure on the substrate includes: sequentially forming a first metal layer and a first insulating layer on the substrate, wherein the first metal layer includes a shading layer; forming a first polysilicon layer on the first insulating layer, wherein the first polysilicon layer includes a first active layer; sequentially forming a second insulating layer and a second metal layer on the first insulating layer on which the first polysilicon layer is formed, wherein the second metal layer includes a first gate electrode and a scanning signal line; the first gate electrode and the second gate electrode are a same electrode; forming a third insulating layer on the second insulating layer on which the second metal layer is formed; forming a second polysilicon layer on the third insulating layer, wherein the second polysilicon layer includes a second active layer; and sequentially forming a fourth insulating layer and a third metal layer on the third insulating layer on which the second polysilicon layer is formed, wherein the third metal layer includes a second source electrode, a second drain electrode, and a data signal line.

In some possible implementations, after the sequentially forming the fourth insulating layer and the third metal layer on the third insulating layer on which the second polysilicon layer is formed, the method further includes: forming a planarization layer on the fourth insulating layer on which the third metal layer is formed; forming a first transparent conductive layer on the planarization layer, wherein the first transparent conductive layer includes a common electrode; forming a fifth insulating layer on the first transparent conductive layer; and forming a second transparent conductive layer on the fifth insulating layer, wherein the second transparent conductive layer includes a pixel electrode.

In some possible implementations, when the first transistor is an N-type transistor and the second transistor is a P-type transistor, the forming the first polysilicon layer on the first insulating layer includes: depositing a first amorphous silicon thin film on the first insulating layer, crystallizing the first amorphous silicon thin film, and processing the crystallized first amorphous silicon thin film through a patterning process to form a first polysilicon thin film, wherein the first polysilicon thin film includes a first region, a second region, a third region, a fourth region, and a fifth region which are arranged along a direction perpendicular to an arrangement direction of the first active layer and the second active layer, the second region and the third region are located at both sides of the first region, the fourth region is located at a side of the second region away from the first region, and the fifth region is located at a side of the third region away from the first region; performing a threshold voltage doping processing on the first polysilicon thin film; performing an N-type heavy doping processing on the fourth region and the fifth region of the first polysilicon thin film; performing an N-type light doping processing on the second region and the third region of the first polysilicon thin film to form the first polysilicon layer; the forming the second polysilicon layer on the third insulating layer includes: depositing a second amorphous silicon thin film on the third insulating layer, crystallizing the second amorphous silicon thin film, and processing the crystallized second amorphous silicon thin film through a patterning process to form a second polysilicon thin film, wherein the second polysilicon thin film includes a first region, a second region, and a third region which are arranged along the direction perpendicular to the arrangement direction of the first active layer and the second active layer, and the second region and the third region are respectively located at both sides of the first region; performing a P-type doping processing on the second region and the third region of the second polysilicon thin film to form the second polysilicon layer; when the first transistor is a P-type transistor and the second transistor is an N-type transistor, the forming the first polysilicon layer on the first insulating layer includes: depositing a first amorphous silicon thin film on the first insulating layer, crystallizing the first amorphous silicon thin film, and processing the crystallized first amorphous silicon thin film through a patterning process to form a first polysilicon thin film, wherein the first polysilicon thin film includes a first region, a second region, and a third region which are arranged along the direction perpendicular to the arrangement direction of the first active layer and the second active layer, the second region and the third region are respectively located at both sides of the first region; performing a P-type doping processing on the second region and the third region of the first polysilicon thin film to form the first polysilicon layer; the forming the second polysilicon layer on the third insulating layer includes: depositing a second amorphous silicon thin film on the third insulating layer, crystallizing the second amorphous silicon thin film, and processing the crystallized second amorphous silicon thin film through a patterning process to form a second polysilicon thin film, wherein the second polysilicon thin film includes a first region, a second region, a third region, a fourth region, and a fifth region which are arranged along the direction perpendicular to the arrangement direction of the first active layer and the second active layer, the second region and the third region are located at both sides of the first region, the fourth region is located at a side of the second region away from the first region, and the fifth region is located at a side of the third region away from the first region; performing a threshold voltage doping processing on the second polysilicon thin film; performing an N-type heavy doping processing on the fourth region and the fifth region of the second polysilicon thin film; and performing an N-type light doping processing on the second region and the third region of the second polysilicon thin film to form the second polysilicon layer.

In a fourth aspect, an embodiment of the present disclosure further provides a driving method of a display substrate, for driving the display substrate described above. The method includes: providing a control signal to a control signal terminal to provide a signal of a signal input terminal to a signal output terminal.

In some possible implementations, when the signal of the signal input terminal is a low-level signal, the providing the control signal to the control signal terminal includes: providing a first control signal to the control signal terminal, wherein the first control signal is a low-level signal; when the signal of the signal input terminal is a low-level signal, the providing the control signal to the control signal terminal includes: providing a second control signal to the control signal terminal, wherein the second control signal is a high-level signal.

Other aspects will become apparent upon reading and understanding accompanying drawings and the detailed description.

BRIEF DESCRIPTION OF DRAWINGS

The accompanying drawings are used for providing an understanding to technical solutions of the embodiments of the present disclosure, form a part of the specification, and are used for explaining, together with the embodiments of the present disclosure, the technical solutions of the embodiments of the present disclosure, but are not intended to form limits to the technical solutions of the embodiments of the present disclosure.

DETAILED DESCRIPTION

Figure 1:
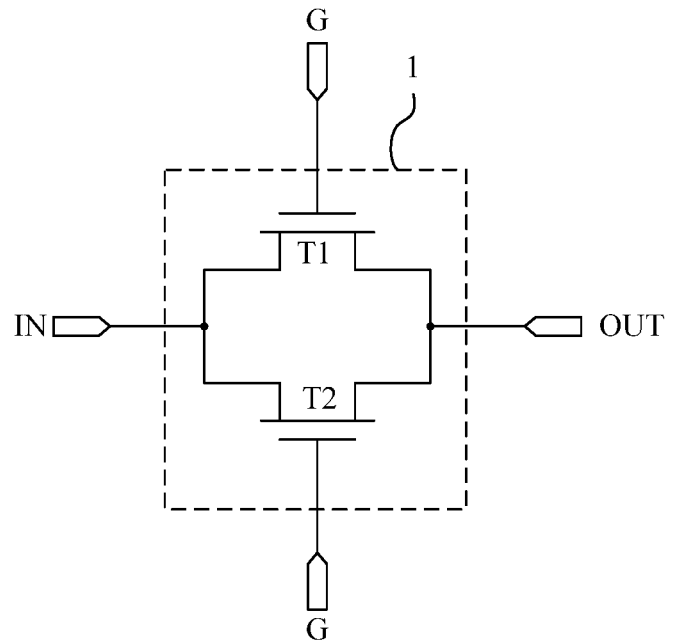
FIG. 1 is a schematic diagram of a switch structure according to an embodiment of the present disclosure.

The present disclosure describes multiple embodiments, but the description is exemplary rather than restrictive. For those of ordinary skill in the art, more embodiments and implementations may be included in the scope of the embodiments described in the present disclosure. Although many possible combinations of features are shown in the accompanying drawings and discussed in specific implementations, many other combinations of the disclosed features are possible. Unless specifically restricted, any feature or element of any embodiment may be combined with any other feature or element in any other embodiment for use, or may take the place of any other feature or element in any other embodiment.

Combinations with features and elements known to those of ordinary skill in the art are included and contemplated in the embodiments of the present disclosure. The embodiments, features and elements that have been disclosed in the present disclosure may also be combined with any conventional features or elements to form technical solutions defined by the claims. Any features or elements of any embodiment may also be combined with features or elements from other technical solutions to form another technical solution defined by the claims. Therefore, any of features shown and/or discussed in the embodiments of the present disclosure may be implemented individually or in any suitable combination. Therefore, the embodiments are not to be limited except the limitation by the appended claims and their equivalents. Furthermore, various modifications and variations may be made within the scope of the appended claims.

Unless otherwise defined, technical terms or scientific terms used in the embodiments shall have common meanings as construed by those of ordinary skill in the art to which the present disclosure pertains. "First", "second", and similar terms used in the embodiments of the present disclosure do not represent any order, number, or significance but are only used to distinguish different components. "Comprise" or "include" and similar terms mean that an element or object appearing before the term includes the elements or objects listed after the term and their equivalents and other components or objects are not excluded. Terms like "connect" or "mutually connect" are not limited to physical or mechanical connection, but may include electrical connection, whether direct or indirect. "Up", "down", "left", "right", and the like are only used to indicate the relative positional relationship. When an absolute position of a described object is changed, a relative positional relationship may also change correspondingly.

In the specification, an "electric connection" includes a case where constituent elements are connected together through an element having some electric function. There is no specific restriction on the "element having some electrical function" as long as it may transmit and receive electrical signals between connected constituent elements. An example of the "element having some electric function" includes not only an electrode and a wiring, but also a switching element such as a transistor, a resistor, an inductor, a capacitor, and another element having various functions, etc.

In the specification, "perpendicular" refers to a state in which an angle formed by two straight lines is greater than 80° and smaller than 100°, and thus may also include a state in which an angle is greater than 85° and smaller than 95°.

As mentioned in this paper, "a region A and a region B are located at both sides of a region C, respectively" means that the region A is located at one side of the region C and the region B is located at the other side of the region C away from the region A.

Figure 2:
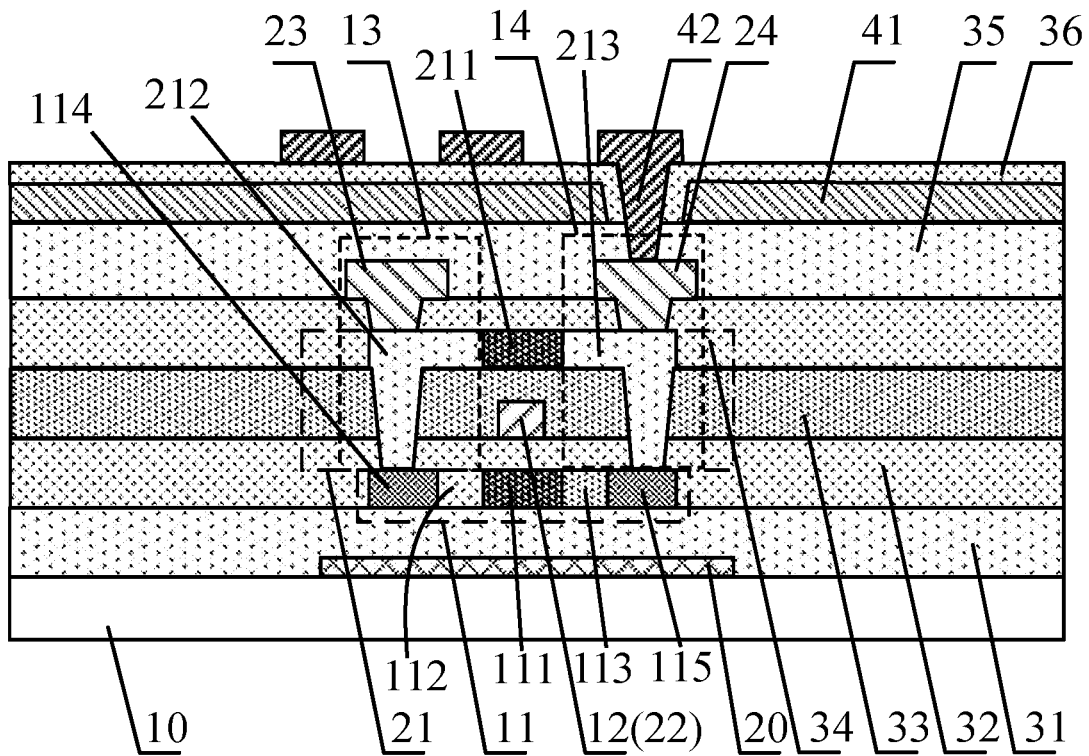
FIG. 2 is a cross-sectional view of a display substrate according to an embodiment of the present disclosure.

FIG. 1 is a schematic diagram of a switch structure according to an embodiment of the present disclosure, and FIG. 2 is a cross-sectional view of a display substrate according to an embodiment of the present disclosure. As shown in FIG. 1 and FIG. 2, a display substrate according to an embodiment of the present disclosure includes a substrate 10, and a switch structure disposed on the substrate 10. The switch structure is electrically connected with a control signal terminal G, a signal input terminal IN, and a signal output terminal OUT, and is configured to provide a signal of the signal input terminal IN to the signal output terminal OUT under control of the control signal terminal G. The switch structure includes: a switch unit 1 including a first transistor T1 and a second transistor T2; the first transistor T1 and the second transistor T2 are of opposite types. FIG. 2 is described by taking the switch structure including one switch unit as an example.

The first transistor T1 includes a first active layer 11, a first gate electrode 12, a first source electrode 13, and a first drain electrode 14, the second transistor T2 includes a second active layer 21, a second gate electrode 22, a second source electrode 23, and a second drain electrode 24.

As shown in FIG. 1, the first gate electrode and the second gate electrode are electrically connected with the control signal terminal G, the first source electrode and the second source electrode are electrically connected with the signal input terminal IN, and the first drain electrode and the second drain electrode are electrically connected with the signal output terminal OUT.

As shown in FIG. 2, an orthographic projection of the first active layer 11 on the substrate 10 coincides with an orthographic projection of the second active layer 21 on the substrate 10.

In an exemplary embodiment, the substrate 10 may be a rigid substrate or a flexible substrate, wherein the rigid substrate may be, but is not limited to, one or more of glass and metal foil; the flexible substrate may be, but is not limited to, one or more of polyethylene terephthalate, ethylene terephthalate, polyether ether ketone, polystyrene, polycarbonate, polyarylester, polyarylate, polyimide, polyvinyl chloride, polyethylene, and textile fibers.

In an exemplary embodiment, the first transistor T1 and the second transistor T2 may be P-type transistors, or may be N-type transistors. When the first transistor T1 is an N-type transistor, the second transistor T2 is a P-type transistor. When the first transistor T1 is a P-type transistor, the second transistor T2 is an N-type transistor.

In an exemplary embodiment, the first active layer 11 and the second active layer 21 are made of a polysilicon material.

In this embodiment, the first transistor T1 and the second transistor T2, which are of opposite types and disposed to be connected in parallel, constitute a transfer gate.

In an exemplary embodiment, the switch structure is turned off when a voltage of a signal of the first gate electrode is 0V and a voltage of a signal of the second gate electrode is 0V. The switch structure is turned on when at least one of the voltage of the signal of the first gate electrode and the voltage of the signal of the second gate electrode is not zero.

In an exemplary embodiment, taking the first transistor T1 being an N-type transistor and the second transistor T2 being a P-type transistor as an example, when a signal of the signal input terminal is a high-level signal, the switch structure may be turned on by providing a high-level signal or a low-level signal to the control signal terminal, and then the signal of the signal input terminal is provided to the signal output terminal. When the control signal terminal provides a high-level signal, the first transistor T1 is turned on and the second transistor T2 is turned off and an absolute value of a gate-source voltage difference of the first transistor is a first difference value. When the control signal terminal provides a low-level signal, the first transistor T1 is turned off, the second transistor T2 is turned on, and an absolute value of a gate-source voltage difference of the second transistor T2 is a second difference value. Since a voltage value of the low-level signal is smaller than a voltage value of the high-level signal, the second difference value is greater than the first difference value. Taking a voltage value of a signal provided by the signal input terminal being 8V as an example, when the control signal terminal provides a high-level signal, a voltage value of a signal of the control signal terminal is 6V, and the first difference value is 2V; when the control signal terminal provides a low-level signal, a voltage value of a signal of the control signal terminal is −6V, and the second difference value is 14V. Since the second difference value is greater than the first difference value, a resistance of the switch structure when the control signal terminal provides the low-level signal is smaller than that when the control signal terminal provides the high-level signal. In this case, in the embodiment of the present disclosure, a low-level signal may be provided to the control signal terminal to turn on the switch structure, thereby improving charging capacity of the switch structure. Similarly, when a signal provided by the signal input terminal is a low-level signal, the second difference value is smaller than the first difference value. Taking a voltage value of a signal provided by the signal input terminal being −8V as an example, when the control signal terminal provides a high-level signal, a voltage value of a signal of the control signal terminal is 6V, and the first difference value is 14V; when the control signal terminal provides a low-level signal, a voltage value of a signal of the control signal terminal is −6V, and the second difference value is 2V. Since the second difference value is smaller than the first difference value, a resistance of the switch structure when the control signal terminal provides the high-level signal is smaller than that when the control signal terminal provides the low-level signal. In this case, in the embodiment of the present disclosure, a high-level signal may be provided to the control signal terminal to turn on the switch structure, thereby improving the charging capacity of the switch structure.

In this embodiment, a signal of the control signal terminal may be controlled according to a signal of the signal input terminal. When the signal of the signal input terminal is a high-level signal, the switch structure may be turned on by providing a low-level signal to the control signal terminal. When the signal of the signal input terminal is a low-level signal, the switch structure may be turned on by providing a high-level signal to the control signal terminal, thus improving the charging capacity of the switch structure, improving flexibility of the switch structure, and avoiding a problem of insufficient charging capacity caused by using a single transistor.

The display substrate includes a plurality of sub-pixels disposed on the substrate. In an exemplary embodiment, the switch structure may be applied in a gate drive circuit, a sub-pixel, or a multiplexer.

When the switch structure is applied in a sub-pixel, an orthographic projection of the first active layer 11 on the substrate 10 coincides with an orthographic projection of the second active layer 21 on the substrate 10, which may affect an aperture ratio of the sub-pixel.

The display substrate according to the embodiment of the present disclosure includes a substrate and a switch structure disposed on the substrate, wherein the switch structure is electrically connected with a control signal terminal, a signal input terminal, and a signal output terminal respectively and is configured to provide a signal of the signal input terminal to the signal output terminal under control of the control signal terminal. The switch structure includes: a switch unit; the switch unit includes a first transistor and a second transistor; the first transistor and the second transistor are of opposite types. The first transistor includes a first active layer, a first gate electrode, a first source electrode, and a first drain electrode, and the second transistor includes a second active layer, a second gate electrode, a second source electrode, and a second drain electrode. The first gate electrode and the second gate electrode are respectively electrically connected with the control signal terminal, the first source electrode and the second source electrode are respectively electrically connected with the signal input terminal, and the first drain electrode and the second drain electrode are respectively electrically connected with the signal output terminal. An orthographic projection of the first active layer on the substrate coincides with an orthographic projection of the second active layer on the substrate. In the embodiment of the present disclosure, the switch structure including the first transistor and the second transistor of opposite types is disposed, charging capacity of the switch structure may be improved, a charging rate of a display product may be effectively improved to support high-frequency driving of the display product, and a display effect may be improved.

Figure 3:
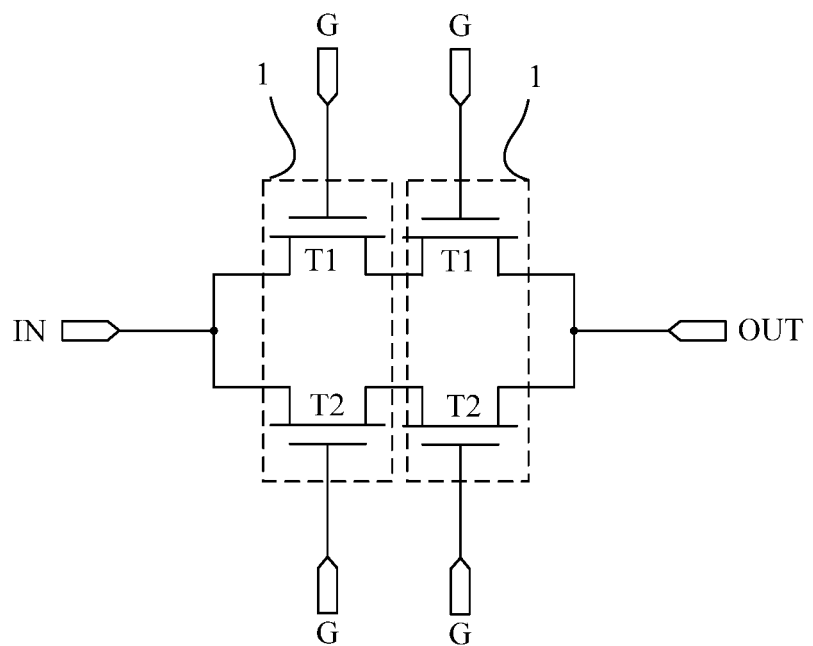
FIG. 3 is a schematic diagram of a switch structure according to an exemplary embodiment.
Figure 4A:
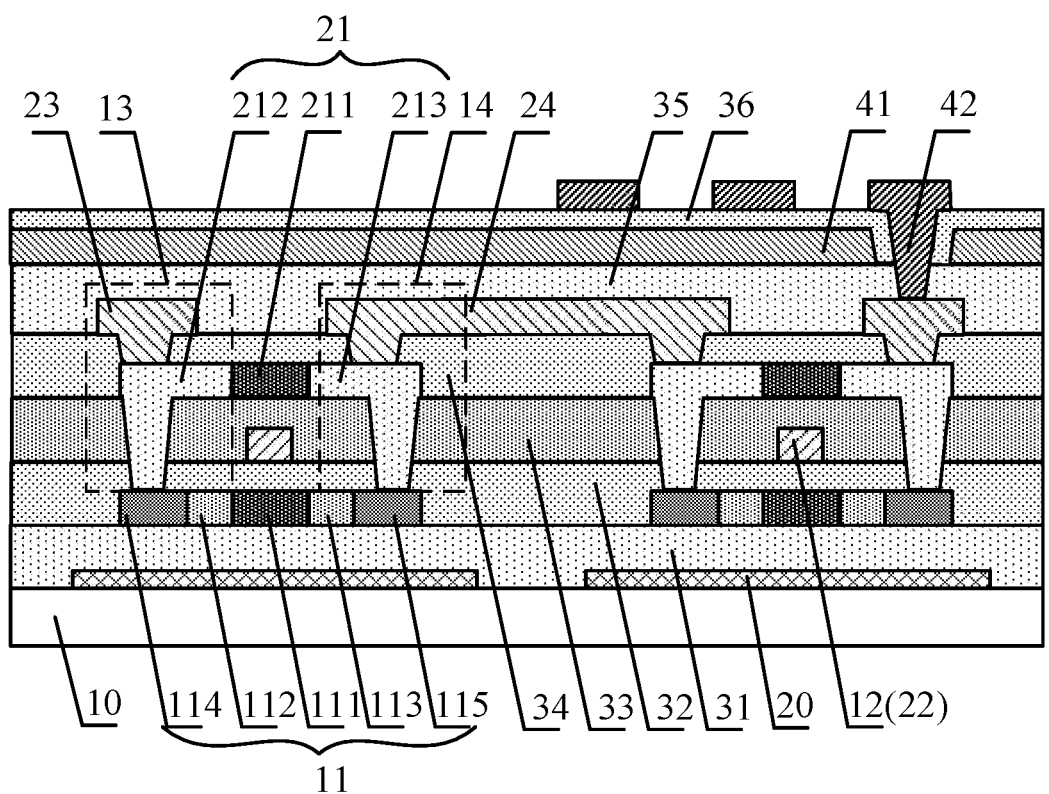
FIG. 4A is a cross-sectional view of a display substrate according to an exemplary embodiment.
Figure 4B:
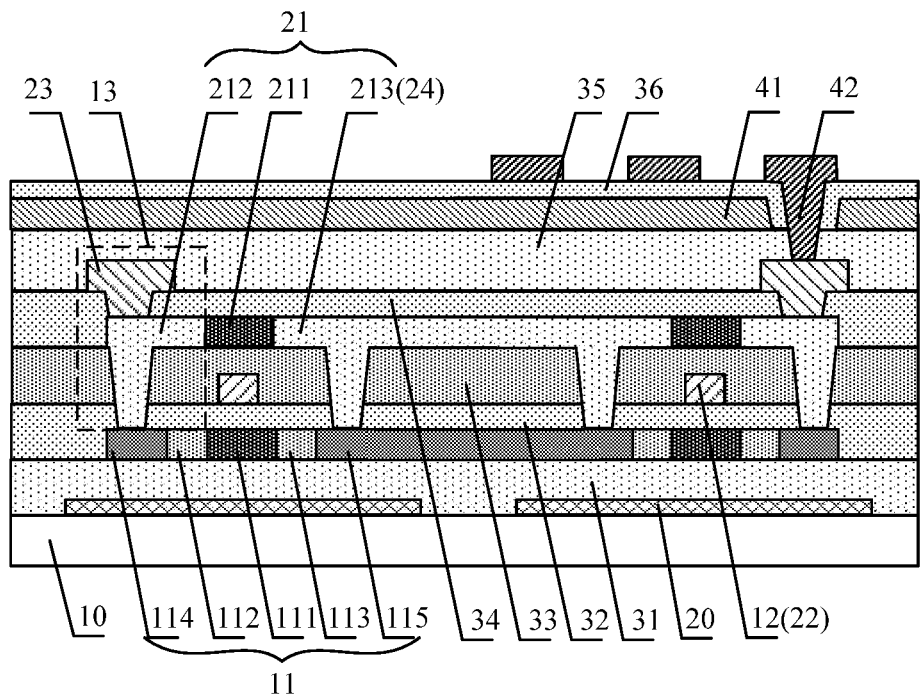
FIG. 4B is a cross-sectional view of a display substrate according to another exemplary embodiment.

FIG. 3 is a schematic diagram of a switch structure according to an exemplary embodiment, FIG. 4A is a cross-sectional view of a display substrate according to an exemplary embodiment, and FIG. 4B is a cross-sectional view of a display substrate according to another exemplary embodiment. As shown in FIG. 3 and FIG. 4A and FIG. 4B, in an exemplary embodiment, the number of switch units is N. FIG. 3 and FIG. 4A and FIG. 4B are described by taking the switch structure including two switch units as an example.

A first source electrode of a first switch unit is electrically connected with a signal input terminal IN, a first drain electrode of a j-th switch unit is electrically connected with a first source electrode of a (j+1)-th switch unit, and a first drain electrode of an N-th switch unit is electrically connected with a signal output terminal OUT. First and second gate electrodes of all switch units are electrically connected with a control signal terminal G, N≥1, 1<j<N.

As shown in FIG. 2 and FIG. 4A and FIG. 4B, in an exemplary embodiment, the display substrate further includes a scanning signal line (not shown in the figures), a data signal line (not shown in the figures), a common electrode 41, and a pixel electrode 42, which are disposed on the substrate.

When the switch structure is applied in a sub-pixel, the scanning signal line is electrically connected with the control signal terminal and is configured to provide a signal to the control signal terminal; the data signal line is connected with the signal input terminal and is configured to provide a signal to the signal input terminal; the signal output terminal is connected with the pixel electrode and is configured to provide a signal to the pixel electrode; the common electrode 41 is located at a side of the pixel electrode 42 close to the substrate 10, and is configured to form an electric field with the pixel electrode.

In an exemplary embodiment, the common electrode 41 and the pixel electrode 42 are transparent electrodes, and the transparent electrodes may be made of indium tin oxide or zinc tin oxide.

In an exemplary embodiment, as shown in FIG. 2 and FIG. 4A and FIG. 4B, a first gate electrode 12 and a second gate electrode 22 are configured as a same electrode.

In an exemplary embodiment, as shown in FIG. 2 and FIG. 4A and FIG. 4B, the first active layer 11 is located at a side of the first gate electrode 12 close to the substrate 10; the second active layer 21 is located at a side of the first gate electrode 12 away from the substrate 10; and the second active layer 21 is connected with the first active layer 11.

In an exemplary embodiment, when the first transistor is an N-type transistor and the second transistor is a P-type transistor, the first active layer 11 includes a first channel region 111, a first doped region 112, a second doped region 113, a third doped region 114, and a fourth doped region 115 which are arranged along a direction perpendicular to an arrangement direction of the first active layer and the second active layer (that is, in a direction parallel to the substrate). The second active layer 21 includes a second channel region 211, a fifth doped region 212, and a sixth doped region 213, which are arranged along the direction perpendicular to the arrangement direction of the first active layer and the second active layer.

The first doped region 112, the second doped region 113, the third doped region 114, the fourth doped region 115, the fifth doped region 212, and the sixth doped region 213 may be conductive.

The first doped region 112 and the second doped region 113 have a same doping type and are located at both sides of the first channel region 111. The third doped region 114 and the fourth doped region 115 have a same doping type.

The third doped region 114 is located at a side of the first doped region 112 away from the first channel region 111, and the fourth doped region 115 is located at a side of the second doped region 113 away from the first channel region 111.

The fifth doped region 212 and the sixth doped region 213 have a same doping type and are located at both sides of the second channel region 211, respectively.

In an exemplary embodiment, as shown in FIG. 2, when the number of switch units is one, in a switch unit, the second source electrode 23 and the second drain electrode 24 are disposed at a side of the second active layer 21 away from the substrate 10. The second source electrode 23 is electrically connected with the third doped region 114 through the fifth doped region 212, and the second source electrode 23 and the fifth doped region 212 are multiplexed into the first source electrode 13. The second drain electrode 24 is electrically connected with the fourth doped region 115 through the sixth doped region 213, and the second drain electrode 24 and the sixth doped region 213 are multiplexed into the first drain electrode 14.

In an exemplary embodiment, when the number of switch units is at least two, in each switch unit, the second source electrode 23 and the second drain electrode 24 are disposed at a side of the second active layer 21 away from the substrate 10. The second source electrode 23 is electrically connected with the third doped region 114 through the fifth doped region 212, and the second source electrode 23 and the fifth doped region 212 are multiplexed into the first source electrode 13. The second drain electrode 24 is electrically connected with the fourth doped region 115 through the sixth doped region 213, and the second drain electrode 24 and the sixth doped region 213 are multiplexed into the first drain electrode 14. A second drain electrode of an i-th switch unit and a second source electrode of an (i+1)-th switch unit are a same electrode, 1≤i<N. FIG. 4A is described by taking two switch units as an example. As shown in FIG. 4A, a second drain electrode of a first switch unit and a second source electrode of a second switch unit are a same electrode.

In an exemplary embodiment, when the number of switch units is at least two, a second source electrode of a first switch unit is disposed at a side of a second active layer of the first switch unit away from a substrate, and a second drain electrode of a last switch unit is disposed at a side of a second active layer of the last switch unit away from the substrate. In the first switch unit, the second source electrode is electrically connected with a third doped region through a fifth doped region, and the second source electrode and the fifth doped region are multiplexed into a first source electrode; the sixth doped region is multiplexed into a second drain electrode, and a fourth doped region is multiplexed into a first drain electrode. In a j-th switch unit, a fifth doped region is multiplexed into a second source electrode, a third doped region is multiplexed into a first source electrode, a sixth doped region multiplexed into a second drain electrode, and a fourth doped region multiplexed into a first drain electrode, 1<j<N. A sixth doped region of a (j−1)-th switch unit and the fifth doped region of the j-th switch unit are a same doped region, and a fourth doped region of the (j−1)-th switch unit and the third doped region of the j-th switch unit are a same doped region. In the last switch unit, a fifth doped region is multiplexed into the second source electrode, a third doped region is multiplexed into a first source electrode, the second drain electrode is electrically connected with a fourth doped region through a sixth doped region, and the second drain electrode and the sixth doped region are multiplexed into a first drain electrode. FIG. 4B is described by taking two switch units as an example. As shown in FIG. 4B, a sixth doped region of a first switch unit and a fifth doped region of a second switch unit are a same doped region, and a fourth doped region of the first switch unit and a third doped region of the second switch unit are a same doped region. In this case, when a switch transistor is turned on, the sixth doped region of the first switch unit and the fifth doped region of the second switch unit, and the fourth doped region of the first switch unit and the third doped region of the second switch unit are equivalent to resistors connected in parallel, which may reduce a resistance of the switch structure and further improve a charging rate of the switch structure.

As shown in FIG. 2 and FIG. 4A and FIG. 4B, the first transistor has a top gate structure and the second transistor has a bottom gate structure.

In an exemplary embodiment, a dopant concentration of the first doped region 112 may be equal to a dopant concentration of the second doped region 113.

In an exemplary embodiment, a dopant concentration of the third doped region 114 may be equal to a dopant concentration of the fourth doped region 115.

In an exemplary embodiment, a dopant concentration of the fifth doped region 212 may be equal to a dopant concentration of the sixth doped region 213.

In an exemplary embodiment, a dopant concentration of the third doped region 114 is greater than a dopant concentration of the first doped region 112. N-type light doping is adopted for the first doped region 112 and the second doped region 113, and N-type heavy doping is adopted for the third doped region 114 and the fourth doped region 115. The first doped region 112 and the second doped region 113 with high resistances are disposed in the first active layer, which may reduce an acceleration distance of electrons under action of an electric field, may effectively reduce heat generation of the first transistor and suppress a leakage current.

In an exemplary embodiment, P-type light doping or P-type heavy doping may be adopted for the fifth doped region 212 and the sixth doped region 213.

In an exemplary embodiment, lengths of the first doped region to the sixth doped region may be controlled by adjusting doped ion species and dopant concentrations.

In an exemplary embodiment, as shown in FIG. 2 and FIG. 4A and FIG. 4B, taking the first transistor being an N-type transistor and the second transistor being a P-type transistor as an example, when a high-level signal is provided to the first gate electrode, the first channel region 111 is in a turn-on state and the second channel region 211 is in a high-resistance state. The first channel region 111 is in the turn-on state, and a path is formed among the second source electrode 23, the fifth doped region 212, the third doped region 114, the first doped region 112, the first channel region 111, the second doped region 113, the fourth doped region 115, the sixth doped region 213, and the second drain electrode 24. Since the second source electrode 23 and the fifth doped region 212 are multiplexed into the first source electrode 13 and the second drain electrode 24 and the sixth doped region 213 are multiplexed into the first drain electrode 14, the above path is formed among the first source electrode 13, the third doped region 114, the first doped region 112, the first channel region 111, the second doped region 113, the fourth doped region 115 and the first drain electrode 14. A voltage signal of the first source electrode is transmitted to the first drain electrode through the path. In this case, the first transistor is in the turn-on state. Since the second channel region 211 is in the high-resistance state, no path can be formed among the second source electrode 23, the fifth doped region 212, the second channel region 211, the sixth doped region 213, and the second drain electrode 24, and the second transistor is in a turn-off state. When a low-level signal is provided to the first gate electrode, the first channel region 111 is in a high-resistance state and the second channel region 211 is in the turn-on state. The first channel region 111 is in the high-resistance state, and no path can be formed among the second source electrode 23, the fifth doped region 212, the third doped region 114, the first doped region 112, the first channel region 111, the second doped region 113, the fourth doped region 115, the sixth doped region 213, and the second drain electrode 24, that is, no path can be formed among the first source electrode 13, the third doped region 114, the first doped region 112, the first channel region 111, the second doped region 113, the fourth doped region 115 and the first drain electrode 14. In this case, the first transistor is in the turn-off state. The second channel region 211 is in the turn-on state, and a path is formed among the second source electrode 23, the fifth doped region 212, the second channel region 211, the sixth doped region 213, and the second drain electrode 24, a voltage signal of the second source electrode 23 is transmitted to the second drain electrode 24 through the path, and the second transistor is in the turn-on state.

It may be known from the above analysis that the first gate electrode 12 and the second gate electrode 22 are a same electrode, that is, the first transistor and the second transistor share a gate, which may not only ensure a normal operation of the switch structure, but also simplify processes and save costs.

FIG. 2 and FIG. 4A and FIG. 4B are described by taking the first transistor being an N-type transistor and the second transistor being a P-type transistor as an example.

In an exemplary embodiment, when the first transistor is the P-type transistor and the second transistor is the N-type transistor, a first active layer includes a first channel region, a first doped region, and a second doped region which are arranged along a direction perpendicular to an arrangement direction of the first active layer and a second active layer. The second active layer includes a second channel region, a third dope region, a fourth doped region, a fifth doped region, and a sixth doped region which are arrange in the direction perpendicular to the arrangement direction of the first active layer and the second active layer.

The first doped region and the second doped region have a same doping type and are located at both sides of the first channel region respectively; the third doped region and the fourth doped region have a same doping type and are located at both sides of the second channel region respectively; the fifth doped region and the sixth doped region have a same doping type, the fifth doped region is located at a side of the third doped region away from the second channel region, and the sixth doped region is located at a side of the fourth doped region away from the second channel region.

A second source electrode is connected with the first doped region through the fifth doped region, and the second source electrode and the fifth doped region are multiplexed into a first source electrode; a second drain electrode is connected with the second doped region through the sixth doped region, and the second drain electrode and the sixth doped region are multiplexed into a first drain electrode.

In an exemplary embodiment, a dopant concentration of the first doped region may be equal to a dopant concentration of the second doped region.

In an exemplary embodiment, a dopant concentration of the third doped region may be equal to a dopant concentration of the fourth doped region.

In an exemplary embodiment, a dopant concentration of the fifth doped region may be equal to a dopant concentration of the sixth doped region.

In an exemplary embodiment, a dopant concentration of the fifth doped region is greater than a dopant concentration of the third doped region.

In an exemplary embodiment, when the number of switch units is one, in a switch unit, a second source electrode and a second drain electrode are disposed at a side of a second active layer away from a substrate; the second source electrode is electrically connected with a first doped region through a fifth doped region, and the second source electrode and the fifth doped region are multiplexed into a first source electrode; the second drain electrode is electrically connected with a second doped region through a sixth doped region, and the second drain electrode and the sixth doped region are multiplexed into a first drain electrode.

In an exemplary embodiment, when the number of switch units is at least two, in each switch unit, a second source electrode and a second drain electrode are disposed at a side of a second active layer away from the substrate; the second source electrode is electrically connected with a first doped region through a fifth doped region, and the second source electrode and the fifth doped region are multiplexed into a first source electrode; the second drain electrode is electrically connected with a second doped region through a sixth doped region, and the second drain electrode and the sixth doped region are multiplexed into a first drain electrode; a second drain electrode of an i-th switch unit and a second source electrode of an (i+1)-th switch unit are a same electrode, $1 \leq i < N$.

In an exemplary embodiment, when the number of switch units is at least two, a second source electrode of a first switch unit is disposed at a side of a second active layer of the first switch unit away from the substrate, and a second drain electrode of a last switch unit is disposed at a side of a second active layer of the last switch unit away from the substrate. In the first switch unit, the second source electrode is electrically connected with a first doped region through a fifth doped region, and the second source electrode and the fifth doped region are multiplexed into a first source electrode; a sixth doped region is multiplexed into a second drain electrode, and a second doped region is multiplexed into a first drain electrode. In a j-th switch unit, a fifth doped region is multiplexed into a second source electrode, a first doped region is multiplexed into a first source electrode, a sixth doped region multiplexed into a second drain electrode, and a second doped region is multiplexed into a first drain electrode, $1 < j < N$. A sixth doped region of a (j−1)-th switch unit and the fifth doped region of the j-th switch unit are a same doped region, and a second doped region of the (j−1)-th switch unit and the first doped region of the j-th switch unit are a same doped region. In the last switch unit, a fifth doped region is multiplexed into the second source electrode, a first doped region is multiplexed into a first source electrode, the second drain electrode is electrically connected with a second doped region through a sixth doped region, and the second drain electrode and the sixth doped region are multiplexed into a first drain electrode. In this case, when a switch transistor is turned on, the sixth doped region of the first switch unit and the fifth doped region of the second switch unit, and the second doped region of the first switch unit and the first doped region of the second switch unit are equivalent to resistors connected in parallel, which may reduce a resistance of the switch structure and further improve a charging rate of the switch structure.

As shown in FIG. 2 and FIG. 4A and FIG. 4B, in an exemplary embodiment, an orthographic projection of the first channel region 111 on the substrate 10 coincides with an orthographic projection of the second channel region 211 on the substrate 10; the orthographic projection of the first channel region 111 on the substrate 10 at least partially overlaps with an orthographic projection of the first gate electrode 12 on the substrate 10.

Figure 5:
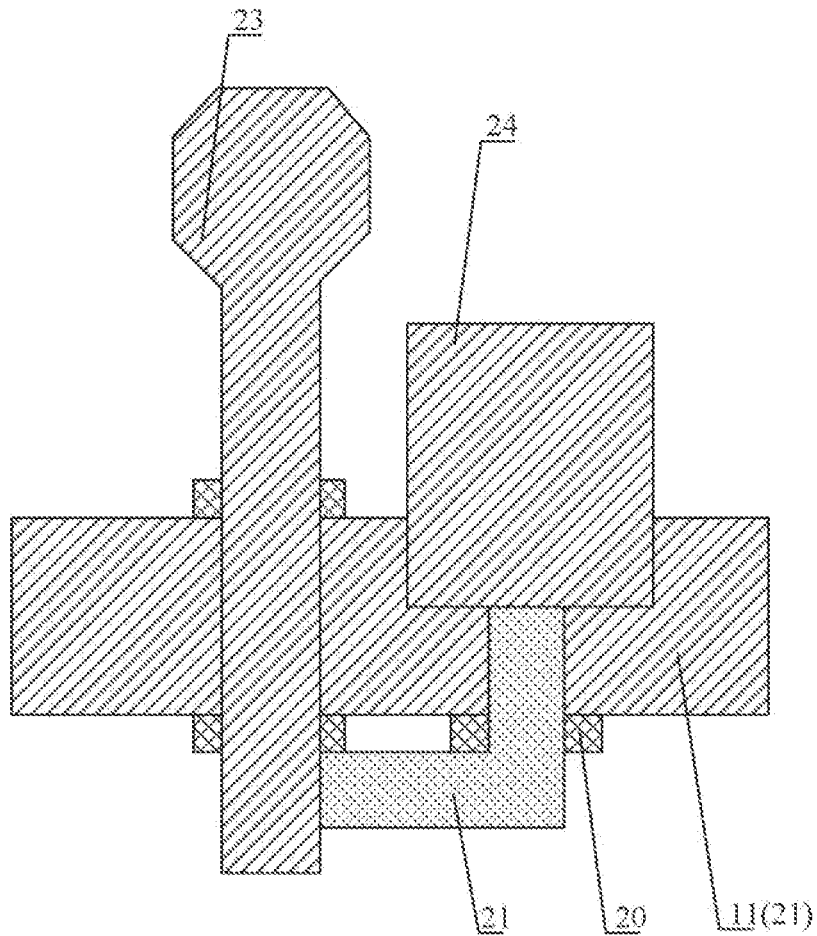
FIG. 5 is a top view of a display substrate according to an exemplary embodiment.

FIG. 5 is a top view of a display substrate according to an exemplary embodiment. As shown in FIG. 2, FIG. 4A and FIG. 4B, and FIG. 5, the display substrate according to the exemplary embodiment further includes a shading layer 20.

The shading layer 20 is located at a side of the first active layer 11 close to the substrate 10, and an orthographic projection of the shading layer 20 on the substrate 10 covers the orthographic projection of the first channel region 111 on the substrate 10.

As shown in FIG. 2, FIG. 4A and FIG. 4B, and FIG. 5, the display substrate according to the exemplary embodiment includes a first metal layer, a first insulating layer 31, a first polysilicon layer, a second insulating layer 32, a second metal layer, a third insulating layer 33, a second polysilicon layer, a fourth insulating layer 34, and a third metal layer, which are sequentially disposed along a direction perpendicular to the substrate.

The first metal layer includes the shading layer 20, the first polysilicon layer includes the first active layer 11, the second metal layer includes the first gate electrode 12 and a scanning signal line, the second polysilicon layer includes the second active layer 21, and the third metal layer includes the second source electrode 23, the second drain electrode 24, and a data signal line.

As shown in FIG. 2 and FIG. 4A and FIG. 4B, the display substrate according to the exemplary embodiment further includes a planarization layer 35, a first transparent conductive layer, a fifth insulating layer 36, and a second transparent conductive layer.

The first transparent conductive layer includes a common electrode 41, and the second transparent conductive layer includes a pixel electrode 42.

The planarization layer 35 is located at a side of the third metal layer away from the substrate 10, the first transparent conductive layer is located at a side of the planarization layer 35 away from the substrate 10, the fifth insulating layer 36 is located at a side of the first transparent conductive layer away from the substrate 10 and the second transparent conductive layer is located at a side of the fifth insulating layer 36 away from the substrate 10.

The planarization layer 35 is disposed with a first via exposing the second drain electrode, and the first transparent conductive layer is disposed with a second via exposing the first via. An orthographic projection of the second via on the substrate covers an orthographic projection of the first via on the substrate. The fifth insulating layer 36 is disposed with a third via exposing the second via. The pixel electrode 42 is connected with the second drain electrode 24 through the first via, the second via, and the third via.

In an exemplary embodiment, the first metal layer, the second metal layer, and the third metal layer may be made of metal materials, such as any one or more of silver (Ag), copper (Cu), aluminum (Al) and molybdenum (Mo), or alloy materials of the above metals, such as aluminum neodymium alloy (AlNd) or molybdenum niobium alloy (MoNb), and may be a single-layer structure or a multi-layer composite structure, such as Mo/Cu/Mo.

The first insulating layer, the second insulating layer, the third insulating layer, the fourth insulating layer, and the fifth insulating layer may be made of any one or more of Silicon Oxide (SiOx), Silicon Nitride (SiNx), and Silicon OxyNitride (SiON), and may be a single layer, a multi-layer, or a composite layer. The first insulating layer is referred to as a buffer layer, which is configured to improve water and oxygen resistance of the substrate, the second insulating layer is referred to as a first gate insulating layer, and the third insulating layer is referred to as a second gate insulating layer, the fourth insulating layer is referred to as an interlayer insulating layer, and the fifth insulating layer is referred to as a passivation layer.

In an exemplary embodiment, a thickness of the second insulating layer may be smaller than a thickness of the third insulating layer, and a thickness of the first insulating layer may be smaller than a sum of the thickness of the second insulating layer and the thickness of the third insulating layer, so that a capacity of a storage capacitor may be improved on a premise of ensuring an insulating effect.

In an exemplary embodiment, the planarization layer may be made of an organic material.

When the display substrate according to an exemplary embodiment is driven at a high frequency, a charging rate of the display substrate may reach 99.75%, which improves a display effect of the display substrate and ensures that the display substrate has no risk of poor display. Poor display refers to bad phenomena such as vertical stripes.

Taking a switch structure including one switch unit, a first transistor being an N-type transistor, and a second transistor being a P-type transistor as an example, a structure of a display substrate according to an exemplary embodiment will be described below through a preparation process of the display substrate. A "patterning process" includes processes, such as film layer deposition, photoresist coating, mask exposure, development, etching, and photoresist stripping. Deposition may be any one or more of sputtering, evaporation, and chemical vapor deposition. Coating may be any one or more of spray coating and spin coating. Etching may be any one or more of dry etching and wet etching. A "thin film" refers to a thin film layer prepared from a material on a substrate by using a process of deposition or coating. If the patterning process is not needed for the "thin film" in the whole preparation process, the "thin film" may also be referred to as a "layer". When the patterning process is needed for the "thin film" in the whole preparation process, the thin film is referred to as a "thin film" before the patterning process and referred to as a "layer" after the patterning process.

Figure 6:
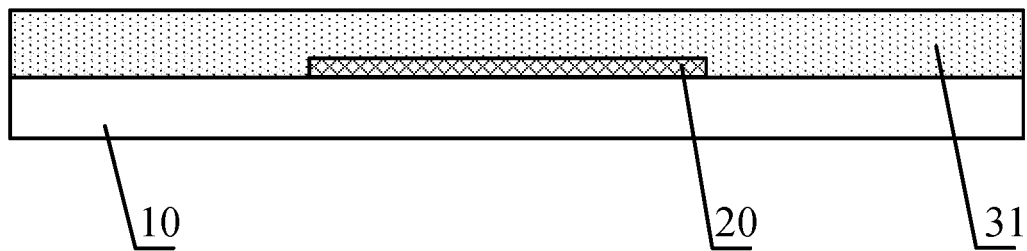
FIG. 6 is a cross-sectional view of forming a first insulating layer.
Figure 7:
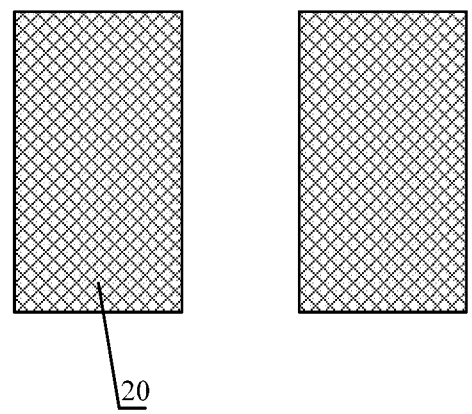
FIG. 7 is a top view of forming a first insulating layer.

(1) Forming of a first metal layer and a first insulating layer, includes: depositing a first metal thin film on a substrate, patterning the first metal thin film through a patterning process to form a first metal layer, depositing a first insulating thin film on a first insulating layer where the first metal layer is formed, and patterning the first insulating thin film through a patterning process to form a first insulating layer 31. The first metal layer includes a shading layer, as shown in FIG. 6 and FIG. 7.

Figure 8:
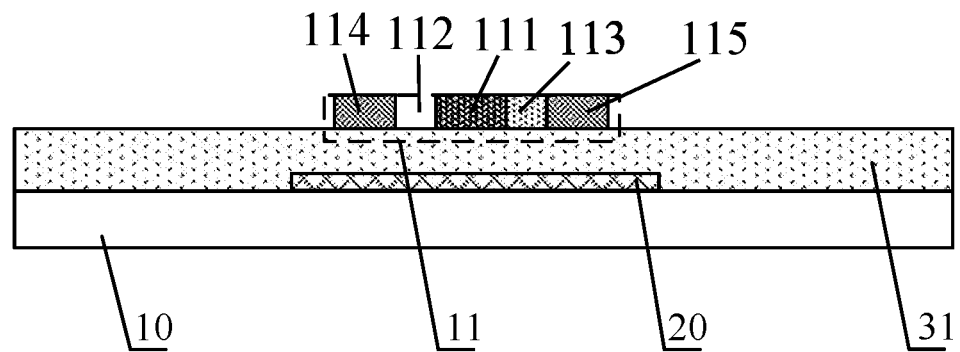
FIG. 8 is a cross-sectional view of forming a first polysilicon layer.
Figure 9:
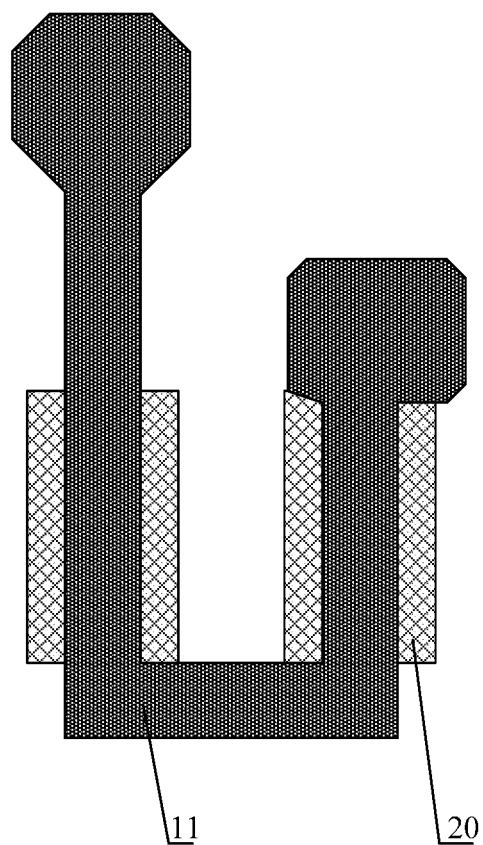
FIG. 9 is a top view of forming a first polysilicon layer.

(2) Forming of a first polysilicon layer, includes: depositing a first amorphous silicon thin film on the formed first insulating layer, crystallizing the first amorphous silicon thin film, patterning the crystallized first amorphous silicon thin film through a patterning process to form a first polysilicon thin film, performing a threshold voltage doping processing on the first polysilicon thin film, performing N-type heavy doping on the first polysilicon thin film to form a third doped region 114 and a fourth doped region 115, and performing P-type light doping on the first polysilicon thin film to form a first doped region 112 and a second doped region 113 to form a first polysilicon layer. The first polysilicon layer includes a first active layer 11, as shown in FIG. 8 and FIG. 9.

Figure 10:
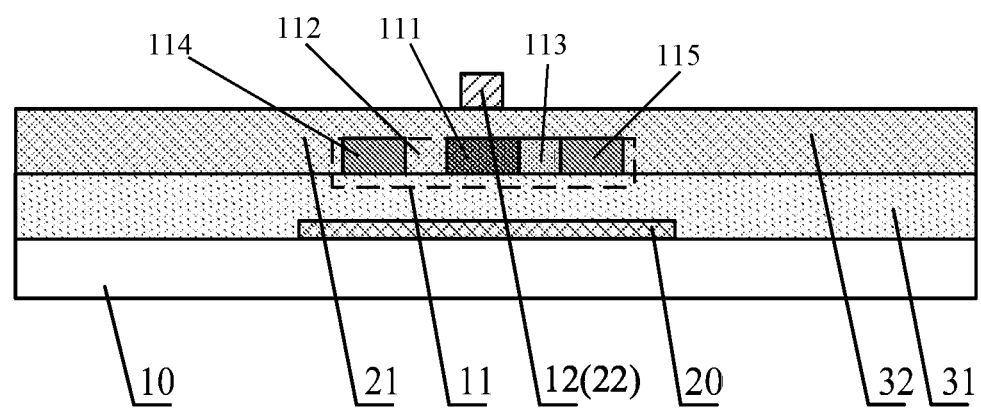
FIG. 10 is a cross-sectional view of forming a second metal layer.
Figure 11:
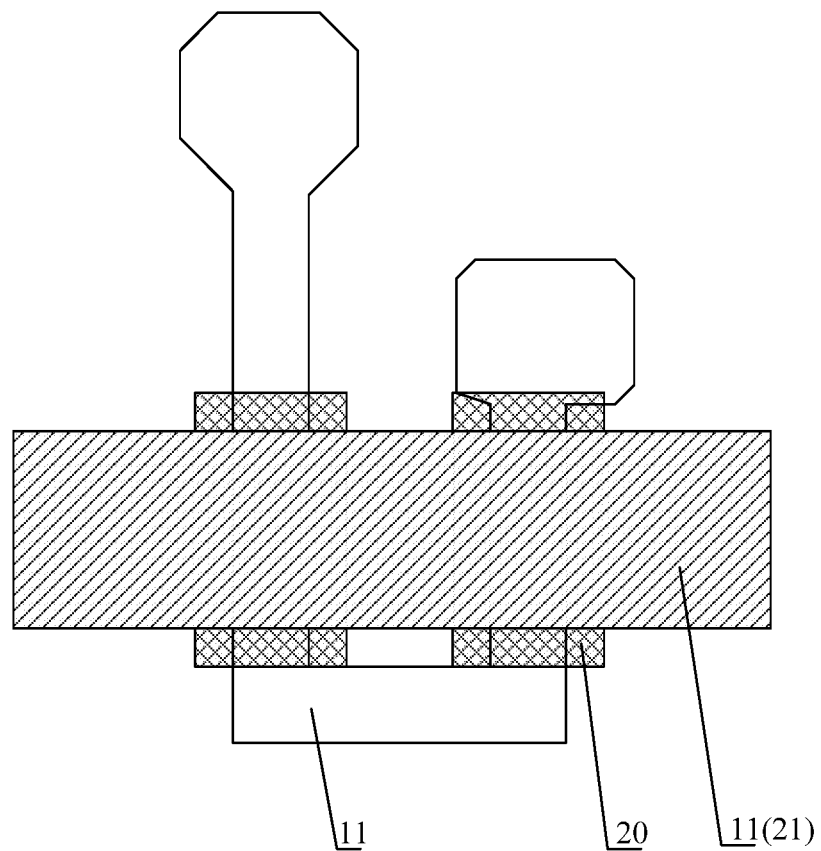
FIG. 11 is a top view of forming a second metal layer.

(3) Forming of a second insulating layer and a second metal layer, includes: depositing a second insulating thin film on the first insulating layer where the first polysilicon layer is formed, patterning the second insulating thin film through a patterning process to form a second insulating layer 32, depositing a second metal thin film on the second insulating layer 32, and patterning the second metal thin film through a patterning process to form a second metal layer. The second metal layer includes a scanning signal line and a first gate electrode 11, as shown in FIG. 10 and FIG. 11.

Figure 12:
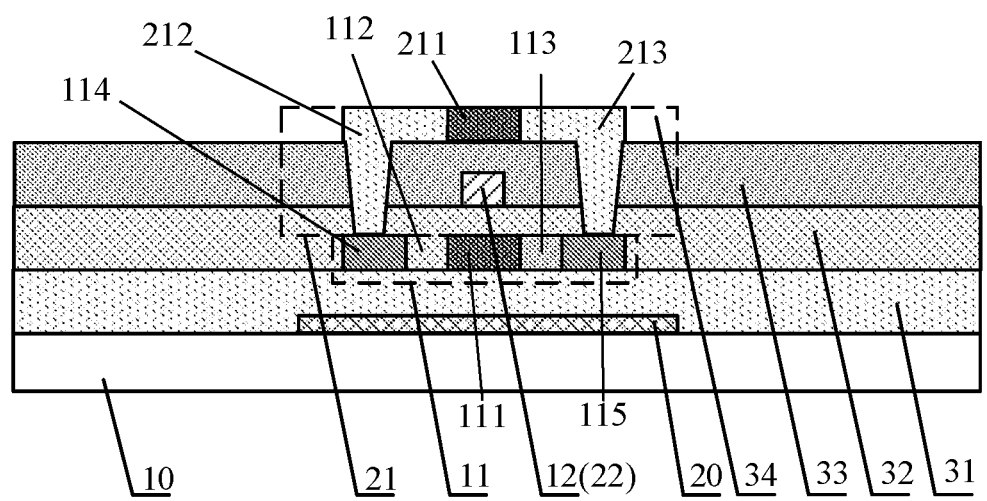
FIG. 12 is a cross-sectional view of forming a second polysilicon layer.
Figure 13:
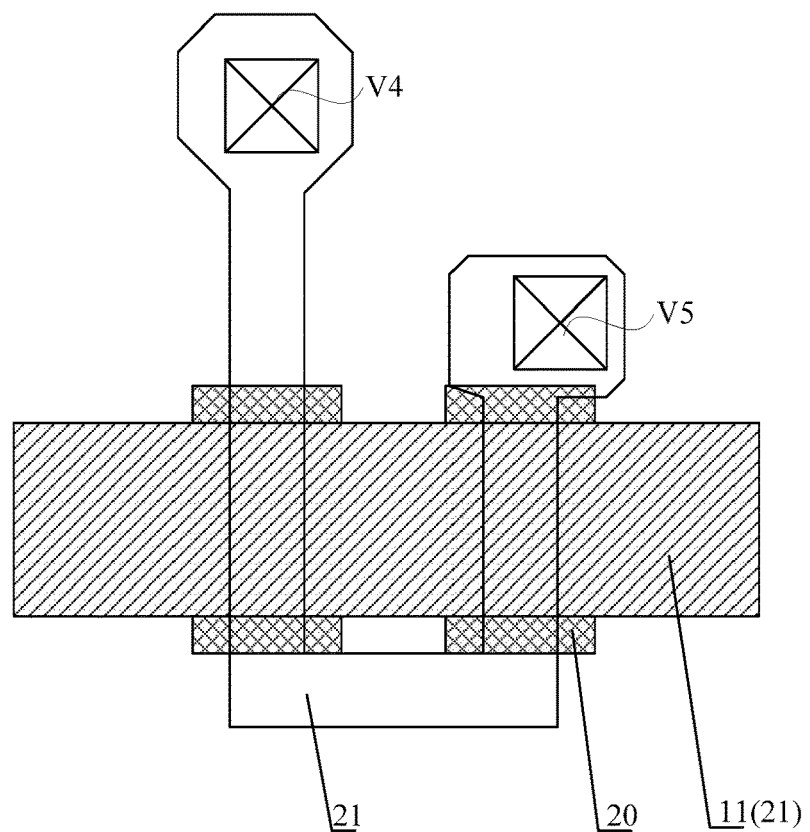
FIG. 13 is a top view of forming a second polysilicon layer.

(4) Forming of a third insulating layer and a second polysilicon layer, includes: depositing a third insulating thin film on the second insulating layer where the second metal layer is formed, patterning the third metal thin film through a patterning process to form a third insulating layer 33, depositing a second amorphous silicon thin film on the third insulating layer 33, crystallizing the second amorphous silicon thin film, patterning the crystallized second amorphous silicon thin film through a patterning process to form a second polysilicon thin film, and performing P-type doping on the first polysilicon thin film to form a fifth doped region 212 and a sixth doped region 213 to form a second polysilicon layer. The second polysilicon layer includes a second active layer 21, as shown in FIG. 12 and FIG. 13.

A fourth via V4 exposing the third doped region 114 and a fifth via V5 exposing the fourth doped region 115 are disposed on the second insulating layer 32 and the third insulating layer 33. The fifth doped region 212 is electrically connected with the third doped region 114 through the fourth via V4, and the sixth doped region 213 is electrically connected with the third doped region 114 through the fifth via V5.

Figure 14:
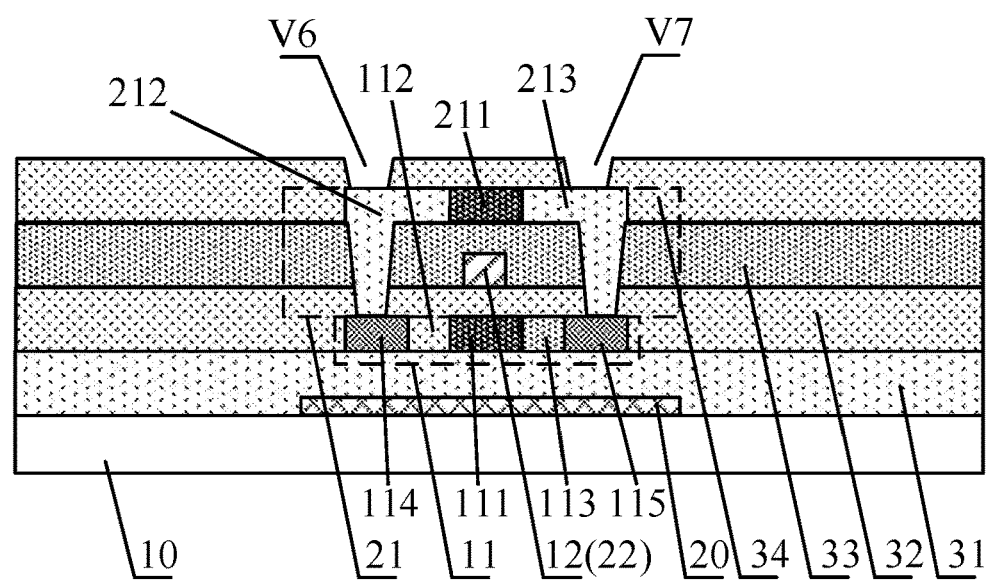
FIG. 14 is a cross-sectional view of forming a fourth insulating layer.
Figure 15:
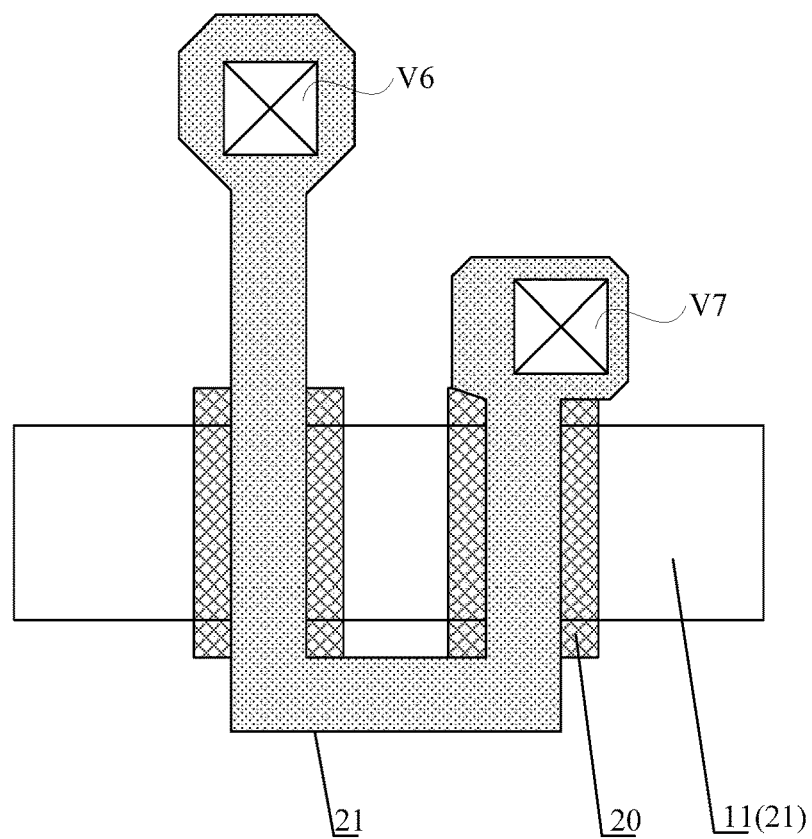
FIG. 15 is a top view of forming a fourth insulating layer.

(5) Forming of a fourth insulating layer, includes: depositing a fourth insulation thin film on the third insulating layer where the second polysilicon layer is formed, and patterning the fourth insulation thin film through a patterning process to form a fourth insulating layer 34, as shown in FIG. 14 and FIG. 15.

The fourth insulating layer 34 is disposed with a sixth via V6 exposing the fifth doped region 212 and a seventh via V7 exposing the sixth doped region 213.

Figure 16:
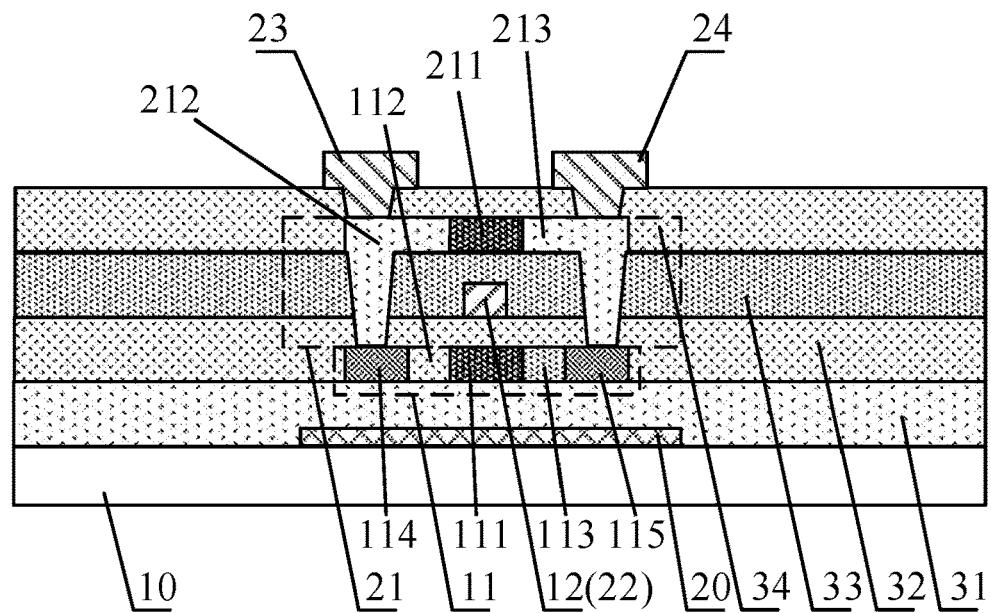
FIG. 16 is a cross-sectional view of forming a third metal layer.
Figure 17:
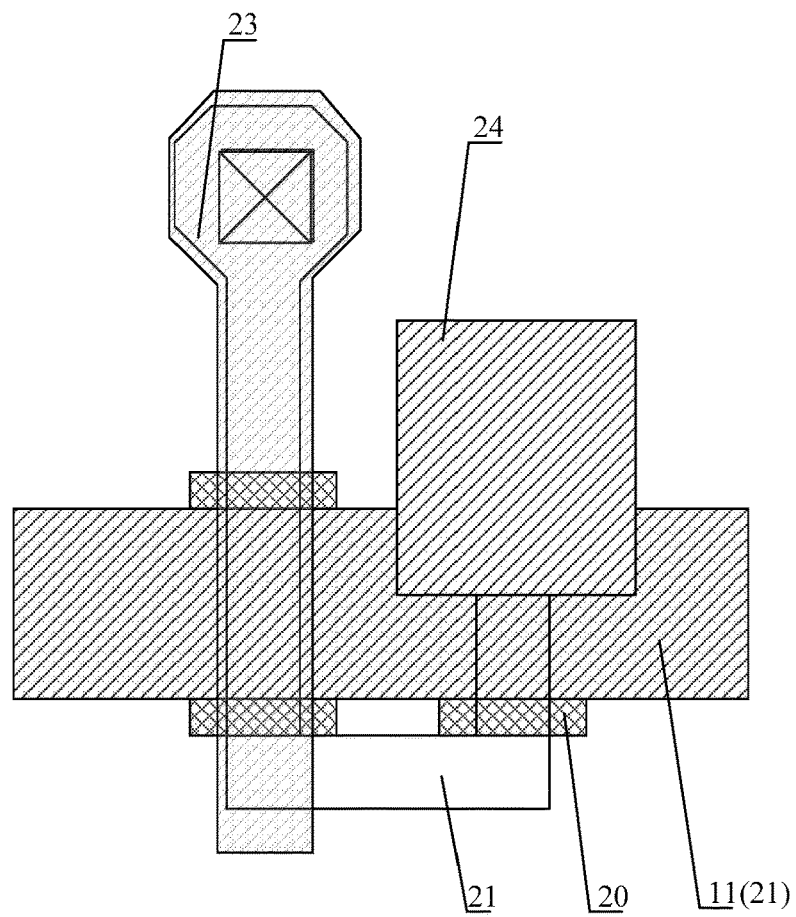
FIG. 17 is a top view of forming a third metal layer.

(6) Forming of a third metal layer, includes: depositing a third metal thin film on the fourth insulating layer 34, patterning the third metal thin film through a patterning process to form a third metal layer, which includes a second source electrode 23, a second drain electrode 24, and a data signal line, as shown in FIG. 16 and FIG. 17.

The fourth insulating layer 34 is disposed with a sixth via exposing the fifth doped region 212 and a seventh via exposing the sixth doped region 213. The second source electrode 23 is electrically connected with the fifth doped region 212 through the sixth via, and the second drain electrode 24 is electrically connected with the sixth doped region 213 through the seventh via.

Figure 18:
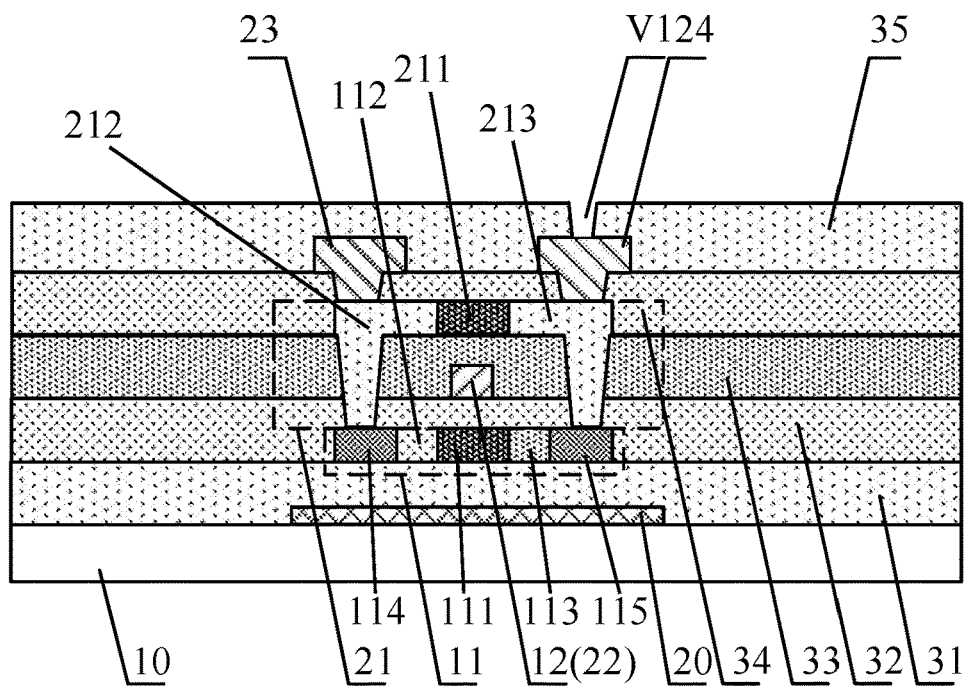
FIG. 18 is a cross-sectional view of forming a planarization layer.

(7) Forming of a planarization layer, includes: coating a planarization thin film on the fourth insulating layer where the third metal layer is formed, and forming a planarization layer 35 by masking, exposing, and developing the planarization thin film. The planarization layer is disposed with a first via V1 exposing the second drain electrode 24, as shown in FIG. 18.

Figure 19:
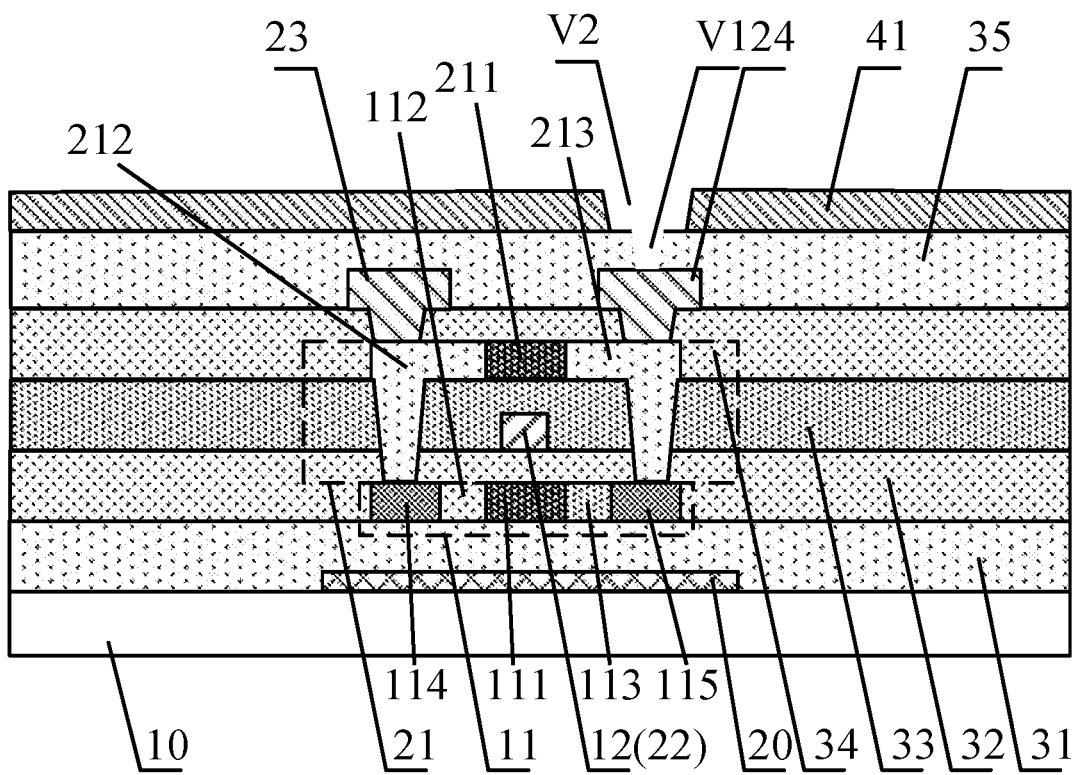
FIG. 19 is a cross-sectional view of forming a first transparent conductive layer.

(8) Forming of a first transparent conductive layer, includes: depositing a first transparent conductive thin film on the planarization layer, and patterning the first transparent conductive thin film through a patterning process to form a first transparent conductive layer. The first transparent conductive layer includes a common electrode 41. The first transparent conductive layer is disposed with a second via V2 exposing the first via V1, and an orthographic projection of the second via V2 on the substrate covers an orthographic projection of the first via V1 on the substrate, as shown in FIG. 19.

(9) Forming of a fifth insulating layer and a second transparent conductive layer, includes: depositing a fifth insulation thin film on the first transparent conductive layer, patterning the fifth insulation thin film through a patterning process to form a fifth insulating layer 36, depositing a second transparent conductive thin film on the fifth insulating layer 36, patterning the second transparent conductive thin film through a patterning process to form a second transparent conductive layer. The second transparent conductive layer includes a pixel electrode 42, as shown in FIG. 2.

The fifth insulating layer is disposed with a third via exposing the second via, and the pixel electrode is connected with the second drain electrode through the first via, the second via, and the third via.

An embodiment of the present disclosure further provides a preparation method of a display substrate, the preparation method of the display substrate according to the embodiment of the present disclosure includes following acts.

In act S1, a substrate is provided.

In act S2, a switch structure is formed on the substrate.

The switch structure is electrically connected with a control signal terminal, a signal input terminal, and a signal output terminal respectively and is configured to provide a signal of the signal input terminal to the signal output terminal under control of the control signal terminal. The switch structure includes: a switch unit; the switch unit includes a first transistor and a second transistor; the first transistor and the second transistor are of opposite types. The first transistor includes a first active layer, a first gate electrode, a first source electrode, and a first drain electrode, and the second transistor includes a second active layer, a second gate electrode, a second source electrode, and a second drain electrode. The first gate electrode and the second gate electrode are respectively electrically connected with the control signal terminal, the first source electrode and the second source electrode are respectively electrically connected with the signal input terminal, and the first drain electrode and the second drain electrode are respectively electrically connected with the signal output terminal. An orthographic projection of the first active layer on the substrate coincides with an orthographic projection of the second active layer on the substrate.

The display substrate is the display substrate according to any of the aforementioned embodiments, and has similar implementation principles and implementation effects, which will not be repeated here.

In an example embodiment, forming of the switch structure on the substrate in the act S2 includes following acts.

In act S21, a first metal layer and a first insulating layer are sequentially formed on the substrate.

The first metal layer includes: a shading layer.

In act S22, a first polysilicon layer is formed on the first insulating layer.

The first polysilicon layer includes: a first active layer.

In act S23, a second insulating layer and a second metal layer are sequentially formed on the first insulating layer where the first polysilicon layer is formed.

The second metal layer includes a first gate electrode and a scanning signal line; the first gate electrode and a second gate electrode are a same electrode.

In act S24, a third insulating layer is formed on the second insulating layer where the second metal layer is formed.

In act S25, a second polysilicon layer is formed on the third insulating layer.

The second polysilicon layer includes a second active layer.

In act S26, a fourth insulating layer and a third metal layer are sequentially formed on the third insulating layer where the second polysilicon layer is formed.

The third metal layer includes a second source electrode, a second drain electrode, and a data signal line.

After the act S26, the preparation method of the display substrate according to the exemplary embodiment further includes following acts.

In act S27, a planarization layer is formed on the fourth insulating layer where the third metal layer is formed.

In act S28, a first transparent conductive layer is formed on the planarization layer.

The first transparent conductive layer includes: a common electrode.

In act S29, a fifth insulating layer is formed on the first transparent conductive layer, and a second transparent conductive layer is formed on the fifth insulating layer.

The second transparent conductive layer includes: a pixel electrode.

In an exemplary embodiment, when the first transistor is an N-type transistor and the second transistor is a P-type transistor, the act S22 includes: depositing a first amorphous silicon thin film on the first insulating layer, crystallizing the first amorphous silicon thin film, processing the crystallized first amorphous silicon thin film through a patterning process to form a first polysilicon thin film, the first polysilicon thin film includes a first region, a second region, a third region, a fourth region, and a fifth region which are arranged along a direction perpendicular to an arrangement direction of a first active layer and a second active layer, wherein the second region and the third region are respectively located at both sides of the first region, the fourth region is located at a side of the second region away from the first region, and the fifth region is located at a side of the third region away from the first region; performing a threshold voltage doping processing on the first polysilicon thin film; performing an N-type heavy doping processing on the fourth region and the fifth region of the first polysilicon thin film; and performing an N-type light doping processing on the second region and the third region of the first polysilicon thin film to form a first polysilicon layer.

In an exemplary embodiment, the performing the N-type heavy doping processing on the fourth and fifth regions of the first polysilicon thin film includes: coating photoresist on the first polysilicon thin film, forming a first opening in the photoresist through a patterning process, the first opening is located above positions at which the fourth region and the fifth region are located; and performing ion implantation on the fourth region and the fifth region of the first polysilicon thin film through the first opening to form a third doped region and a fourth doped region.

In an exemplary embodiment, the performing the N-type light doping processing on the second region and the third region of the first polysilicon thin film, includes: coating photoresist on the first polysilicon thin film, forming a second opening in the photoresist through a patterning process, the second opening is located above positions where the second region and the third region are located; and performing ion implantation on the second region and third region of the first polysilicon thin film through the second opening to form a third doped region and a fourth doped region.

In an exemplary embodiment, when the first transistor is an N-type transistor and the second transistor is a P-type transistor, the act S25 includes: depositing a second amorphous silicon thin film on the third insulating layer, crystallizing the second amorphous silicon thin film, and processing the crystallized second amorphous silicon thin film through a patterning process to form a second polysilicon thin film, the second polysilicon thin film includes a first region, a second region, and a third region which are arranged along a direction perpendicular to an arrangement direction of a first active layer and a second active layer, and the second region and the third region are respectively located at both sides of the first region; performing a P-type doping processing on the second region and the third region of the second polysilicon thin film to form a second polysilicon layer.

In an exemplary embodiment, the performing the P-type doping processing on the second region and the third region of the second polysilicon thin film, includes: coating photoresist on the second polysilicon thin film, forming an opening in the photoresist through a patterning process, wherein the opening is located above positions where the second region and the third region are located; and performing ion implantation on the second region and the third region of the second polysilicon thin film through the opening to form a fifth doped region and a sixth doped region.

In an exemplary embodiment, when the first transistor is a P-type transistor and the second transistor is an N-type transistor, the act S22 includes: depositing a first amorphous silicon thin film on the first insulating layer, crystallizing the first amorphous silicon thin film, and processing the crystallized first amorphous silicon thin film through a patterning process to form a first polysilicon thin film, the first polycrystalline silicon thin film includes a first region, a second region, and a third region which are arranged along a direction perpendicular to an arrangement direction of a first active layer and a second active layer, and the second region and the third region are respectively located at both sides of the first region; performing a P-type doping processing on the second region and the third region of the first polysilicon thin film to form a first polysilicon layer.

In an exemplary embodiment, the performing the P-type doping processing on the second region and the third region of the first polysilicon thin film, includes: coating photoresist on the first polysilicon thin film, forming an opening in the photoresist through a patterning process, wherein the opening is located above positions where the second region and the third region are located; and performing ion implantation on the second region and the third region of the first polysilicon thin film through the opening to form a first doped region and a second doped region.

In an exemplary embodiment, when the first transistor is a P-type transistor and the second transistor is an N-type transistor, the act S25 includes: depositing a second amorphous silicon thin film on the third insulating layer, crystallizing the second amorphous silicon thin film, and processing the crystallized second amorphous silicon thin film through a patterning process to form a second polysilicon thin film, the second polysilicon thin film includes a first region, a second region, a third region, a fourth region, and a fifth region which are arranged along a direction perpendicular to an arrangement direction of a first active layer and a second active layer, wherein the second region and the third region are respectively located at both sides of the first region, the fourth region is located at a side of the second region away from the first region, and the fifth region is located at a side of the third region away from the first region; performing a threshold voltage doping processing on the second polysilicon thin film; performing an N-type heavy doping processing on the fourth region and the fifth region of the second polysilicon thin film; and performing an N-type light doping processing on the second region and the third region of the second polysilicon thin film to form a second polysilicon layer.

In an exemplary embodiment, the performing the N-type heavy doping processing on the fourth region and the fifth region of the second polysilicon thin film, includes: coating photoresist on the second polysilicon thin film, forming a first opening in the photoresist through a patterning process, the first opening is located above positions wherein the fourth region and the fifth region are located; and performing ion implantation on the fourth region and the fifth region of the second polysilicon thin film through the first opening to form a fifth doped region and a sixth doped region.

In an exemplary embodiment, the performing the N-type light doping processing on the second region and the third region of the second polysilicon thin film, includes: coating photoresist on the second polysilicon thin film, forming a second opening in the photoresist through a patterning process, the second opening is located above positions where the second region and the third region are located; and performing ion implantation on the second region and the third region of the second polysilicon thin film through the second opening to form a third doped region and a fourth doped region.

An embodiment of the present disclosure further provides a driving method of a display substrate, which is used for driving the display substrate. The driving method of the display substrate according to the embodiment of the present disclosure includes: providing a control signal to a control signal terminal to provide a signal of a signal input terminal to a signal output terminal.

The display substrate is the display substrate according to any of the aforementioned embodiments, and has similar implementation principles and implementation effects.

In an exemplary embodiment, when the signal of the signal input terminal is a high-level signal, the providing the control signal to the control signal terminal includes: providing a first control signal to the control signal terminal, wherein the first control signal is a low-level signal.

In an exemplary embodiment, when the signal of the signal input terminal is a low-level signal, the providing the control signal to the control signal terminal includes: providing a second control signal to the control signal terminal, wherein the second control signal is a high-level signal.

An embodiment of the present disclosure further provides a display apparatus, including a display substrate.

In an exemplary embodiment, the display device may be a mobile phone, a tablet computer, a television, a display, a notebook computer, a digital photo frame, or a navigator.

The display substrate is the display substrate according to any of the aforementioned embodiments, and has similar implementation principles and implementation effects.

The drawings of the embodiments of the present disclosure only involve structures involved in the embodiments of the present disclosure, and other structures may refer to conventional designs.

For the sake of clarity, thicknesses and sizes of layers or microstructures are exaggerated in the drawings used to describe the embodiments of the present disclosure. When an element such as a layer, film, region, or substrate is described as being "on" or "under" another element, the element may be "directly" located "on" or "under" the another element, or an intermediate element may exist.

Although the implementations disclosed in the present disclosure are as above, the described contents are only implementation adopted for convenience of understanding the present disclosure and are not intended to limit the present disclosure. Any skill in the art to which the present disclosure belongs may make any modifications and changes in implementation forms and details without departing from the spirit and scope disclosed in the present disclosure. However, the scope of patent protection of the present disclosure is still subject to the scope defined by the appended claims.

The invention claimed is:

1. A display substrate, comprising: a substrate and a switch structure disposed on the substrate, wherein the switch structure is electrically connected with a control signal terminal, a signal input terminal, and a signal output terminal, and is configured to provide a signal of the signal input terminal to the signal output terminal under control of the control signal terminal;
   the switch structure comprises: a switch unit; the switch unit comprises a first transistor and a second transistor; the first transistor and the second transistor are of opposite types;
   the first transistor comprises: a first active layer, a first gate electrode, a first source electrode, and a first drain electrode, the second transistor comprises: a second active layer, a second gate electrode, a second source electrode, and a second drain electrode;
   the first gate electrode and the second gate electrode are electrically connected with the control signal terminal, the first source electrode and the second source electrode are electrically connected with the signal input terminal, and the first drain electrode and the second drain electrode are electrically connected with the signal output terminal; and
   an orthographic projection of the first active layer on the substrate coincides with an orthographic projection of the second active layer on the substrate.

2. The display substrate according to claim 1, wherein a quantity of switch units is N;
   a first source electrode of a first switch unit is electrically connected with the signal input terminal, a first drain electrode of a j-th switch unit is electrically connected with a first source electrode of a (j+1)-th switch unit, and a first drain electrode of an N-th switch unit is electrically connected with the signal output terminal; and
   first gate electrode and second gate electrode of all switch units are electrically connected with the control signal terminal, $N \geq 1$, $1 < j < N$.

3. The display substrate according to claim 1, further comprising: a scanning signal line, a data signal line, a common electrode, and a pixel electrode which are disposed on the substrate;

the scanning signal line is electrically connected with the control signal terminal and configured to provide a signal to the control signal terminal;

the data signal line is connected with the signal input terminal and configured to provide a signal to the signal input terminal;

the signal output terminal is connected with the pixel electrode and configured to provide a signal to the pixel electrode;

the common electrode is located at a side of the pixel electrode close to the substrate, and is configured to form an electric field with the pixel electrode.

4. The display substrate according to claim 3, wherein the first gate electrode and the second gate electrode are configured as a same electrode;

the first active layer is located at a side of the first gate electrode close to the substrate; the second active layer is located at a side of the first gate electrode away from the substrate; and the second active layer is connected with the first active layer.

5. The display substrate according to claim 4, wherein when the first transistor is an N-type transistor and the second transistor is a P-type transistor:

the first active layer comprises: a first channel region, a first doped region, a second doped region, a third doped region, and a fourth doped region which are arranged along a direction parallel to the substrate;

the first doped region and the second doped region have a same doping type and are respectively located at both sides of the first channel region;

the third doped region and the fourth doped region have a same doping type, the third doped region is located at a side of the first doped region away from the first channel region, and the fourth doped region is located at a side of the second doped region away from the first channel region;

a dopant concentration of the third doped region is greater than a dopant concentration of the first doped region;

the second active layer comprises: a second channel region, a fifth dope region, and a sixth doped region which are arranged along a direction perpendicular to an arrangement direction of the first active layer and the second active layer; and the fifth doped region and the sixth doped region have a same doping type and are located at both sides of the second channel region, respectively.

6. The display substrate according to claim 5, wherein when a quantity of switch units is one, in the switch unit, the second source electrode and the second drain electrode are disposed at a side of the second active layer away from the substrate; the second source electrode is electrically connected with the third doped region through the fifth doped region, and the second source electrode and the fifth doped region are multiplexed into a first source electrode; the second drain electrode is electrically connected with the fourth doped region through the sixth doped region, and the second drain electrode and the sixth doped region are multiplexed into a first drain electrode;

when the quantity of switch units is at least two, in each switch unit, the second source electrode and the second drain electrode are disposed at a side of the second active layer away from the substrate; the second source electrode is electrically connected with the third doped region through the fifth doped region, and the second source electrode and the fifth doped region are multiplexed into a first source electrode; the second drain electrode is electrically connected with the fourth doped region through the sixth doped region, and the second drain electrode and the sixth doped region are multiplexed into a first drain electrode; a second drain electrode of an i-th switch unit and a second source electrode of an (i+1)-th switch unit are a same electrode, $1 \leq i < N$; or when the quantity of switch units is at least two, a second source electrode of a first switch unit is disposed at a side of a second active layer of the first switch unit away from the substrate, and a second drain electrode of a last switch unit is disposed at a side of a second active layer of the last switch unit away from the substrate; in the first switch unit, the second source electrode is electrically connected with the third doped region through the fifth doped region, and the second source electrode and the fifth doped region are multiplexed into a first source electrode; the sixth doped region is multiplexed into a second drain electrode, and the fourth doped region is multiplexed into a first drain electrode; in a j-th switch unit, the fifth doped region is multiplexed into a second source electrode, the third doped region is multiplexed into a first source electrode, the sixth doped region is multiplexed into a second drain electrode, and the fourth doped region is multiplexed into a first drain electrode, $1 < j < N$; a sixth doped region of a (j−1)-th switch unit and the fifth doped region of the j-th switch unit are a same doped region, and a fourth doped region of the (j−1)-th switch unit and the third doped region of the j-th switch unit are a same doped region; in the last switch unit, the fifth doped region is multiplexed into a second source electrode, the third doped region is multiplexed into a first source electrode, the second drain electrode is electrically connected with the fourth doped region through the sixth doped region, and the second drain electrode and the sixth doped region are multiplexed into a first drain electrode.

7. The display substrate according to claim 6, wherein when the first transistor is a P-type transistor and the second transistor is an N-type transistor:

the first active layer comprises: a first channel region, a first doped region, and a second doped region which are arranged along a direction parallel to the substrate;

the first doped region and the second doped region have a same doping type and are respectively located at both sides of the first channel region;

the second active layer comprises a second channel region, a third doped region, a fourth doped region, a fifth doped region, and a sixth doped region which are arranged along the direction parallel to the substrate;

the third doped region and the fourth doped region have a same doping type and are located at both sides of the second channel region respectively;

the fifth doped region and the sixth doped region have a same doping type, the fifth doped region is located at a side of the third doped region away from the second channel region, and the sixth doped region is located at a side of the fourth doped region away from the second channel region; and a dopant concentration of the fifth doped region is greater than a dopant concentration of the third doped region.

8. The display substrate according to claim 7, wherein when the quantity of switch units is one, in the switch unit, the second source electrode and the second drain electrode are disposed at a side of the second active layer away from the substrate; the second source electrode is electrically connected with the first doped region through the fifth doped region, and the second source electrode and the fifth doped region are multiplexed into a first source electrode; the second drain electrode is electrically connected with the second doped region through the sixth doped region, and the second drain electrode and the sixth doped region are multiplexed into a first drain electrode;

when the quantity of switch units is at least two, in each switch unit, the second source electrode and the second drain electrode are disposed at a side of the second active layer away from the substrate; the second source electrode is electrically connected with the first doped region through the fifth doped region, and the second source electrode and the fifth doped region are multiplexed into a first source electrode; the second drain electrode is electrically connected with the second doped region through the sixth doped region, and the second drain electrode and the sixth doped region are multiplexed into a first drain electrode; a second drain electrode of an i-th switch unit and a second source electrode of an (i+1)-th switch unit are a same electrode, $1 \leq i < N$; or when the quantity of switch units is at least two, a second source electrode of a first switch unit is disposed at a side of a second active layer of the first switch unit away from the substrate, and a second drain electrode of a last switch unit is disposed at a side of a second active layer of the last switch unit away from the substrate; in the first switch unit, the second source electrode is electrically connected with the first doped region through the fifth doped region, and the second source electrode and the fifth doped region are multiplexed into a first source electrode; the sixth doped region is multiplexed into a second drain electrode, and the second doped region is multiplexed into a first drain electrode; in a j-th switch unit, the fifth doped region is multiplexed into a second source electrode, the first doped region is multiplexed into a first source electrode, the sixth doped region is multiplexed into a second drain electrode, and the second doped region is multiplexed into a first drain electrode, $1 < j < N$; a sixth doped region of a (j−1)-th switch unit and the fifth doped region of the j-th switch unit are a same doped region, and a second doped region of the (j−1)-th switch unit and the first doped region of the j-th switch unit are a same doped region; in the last switch unit, the fifth doped region is multiplexed into a second source electrode, the first doped region is multiplexed into a first source electrode, the second drain electrode is electrically connected with the second doped region through the sixth doped region, and the second drain electrode and the sixth doped region are multiplexed into a first drain electrode.

9. The display substrate according to claim 5, wherein an orthographic projection of the first channel region on the substrate coincides with an orthographic projection of the second channel region on the substrate; and the orthographic projection of the first channel region on the substrate is at least partially overlapped with an orthographic projection of the first gate electrode on the substrate.

10. The display substrate according to claim 9, further comprising: a shading layer;

the shading layer is located at a side of the first active layer close to the substrate, and an orthographic projection of the shading layer on the substrate covers the orthographic projection of the first channel region on the substrate.

11. The display substrate according to claim 10, wherein the display substrate comprises: a first metal layer, a first insulating layer, a first polysilicon layer, a second insulating layer, a second metal layer, a third insulating layer, a second polysilicon layer, a fourth insulating layer, and a third metal layer, which are sequentially disposed along a direction perpendicular to the substrate; and the first metal layer comprises a shading layer, the first polysilicon layer comprises a first active layer, the second metal layer comprises a first gate electrode and a scanning signal line, the second polysilicon layer comprises a second active layer, and the third metal layer comprises a second source electrode, a second drain electrode, and a data signal line.

12. The display substrate according to claim 11, further comprising: a planarization layer, a first transparent conductive layer, a fifth insulating layer, and a second transparent conductive layer;

the planarization layer is located at a side of the third metal layer away from the substrate, and the planarization layer is disposed with a first via exposing the second drain electrode;

the first transparent conductive layer is located at a side of the planarization layer away from the substrate, and the first transparent conductive layer is disposed with a second via exposing the first via; an orthographic projection of the second via on the substrate covers an orthographic projection of the first via on the substrate; and the first transparent conductive layer comprises: a common electrode;

the fifth insulating layer is located at a side of the first transparent conductive layer away from the substrate, and the fifth insulating layer is disposed with a third via exposing the second via;

the second transparent conductive layer is located at a side of the fifth insulating layer away from the substrate, and comprises: a pixel electrode connected with the second drain electrode through the first via, the second via, and the third via.

13. A display apparatus, comprising: the display substrate according to claim 1.

14. A preparation method for a display substrate, configured to form the display substrate according to claim 1, the method comprising:

providing the substrate; and forming the switch structure on the substrate; the switch structure is electrically connected with the control signal terminal, the signal input terminal, and the signal output terminal respectively and is configured to provide the signal of the signal input terminal to the signal output terminal under control of the control signal terminal; the switch structure comprises: the switch unit; the switch unit comprises the first transistor and the second transistor; the first transistor and the second transistor are of opposite types; the first transistor comprises the first active layer, the first gate electrode, the first source electrode, and the first drain electrode, and the second transistor comprises the second active layer, the second gate electrode, the second source electrode, and the second drain electrode; the first gate electrode and the second gate electrode are respectively electrically connected with the control signal terminal, the first source electrode and the second source electrode are respectively electrically connected with the signal input terminal, and the first drain electrode and the second drain electrode are respectively electrically connected with the signal output terminal; and the orthographic projection of the first active layer on the substrate coincides with the orthographic projection of the second active layer on the substrate.

15. The method according to claim 14, wherein forming the switch structure on the substrate comprises:
sequentially forming a first metal layer and a first insulating layer on the substrate, wherein the first metal layer comprises a shading layer;
forming a first polysilicon layer on the first insulating layer, wherein the first polysilicon layer comprises a first active layer;
sequentially forming a second insulating layer and a second metal layer on the first insulating layer on which the first polysilicon layer is formed, wherein the second metal layer comprises the first gate electrode and a scanning signal line; the first gate electrode and the second gate electrode are a same electrode;
forming a third insulating layer on the second insulating layer on which the second metal layer is formed;
forming a second polysilicon layer on the third insulating layer, wherein the second polysilicon layer comprises a second active layer; and
sequentially forming a fourth insulating layer and a third metal layer on the third insulating layer on which the second polysilicon layer is formed, wherein the third metal layer comprises a second source electrode, a second drain electrode, and a data signal line.

16. The method according to claim 15, wherein after sequentially forming the fourth insulating layer and the third metal layer on the third insulating layer on which the second polysilicon layer is formed, the method further comprises:
forming a planarization layer on the fourth insulating layer on which the third metal layer is formed;
forming a first transparent conductive layer on the planarization layer, wherein the first transparent conductive layer comprises a common electrode;
forming a fifth insulating layer on the first transparent conductive layer; and
forming a second transparent conductive layer on the fifth insulating layer, wherein the second transparent conductive layer comprises a pixel electrode.

17. The method according to claim 16, wherein in a case that the first transistor is an N-type transistor and the second transistor is a P-type transistor,
forming the first polysilicon layer on the first insulating layer comprises:
depositing a first amorphous silicon thin film on the first insulating layer, crystallizing the first amorphous silicon thin film, and processing the crystallized first amorphous silicon thin film through a patterning process to form a first polysilicon thin film, wherein the first polysilicon thin film comprises a first region, a second region, a third region, a fourth region, and a fifth region which are arranged along a direction parallel to the substrate, the second region and the third region are located at both sides of the first region, the fourth region is located at a side of the second region away from the first region, and the fifth region is located at a side of the third region away from the first region;
performing a threshold voltage doping processing on the first polysilicon thin film;
performing an N-type heavy doping processing on the fourth region and the fifth region of the first polysilicon thin film;
performing an N-type light doping processing on the second region and the third region of the first polysilicon thin film to form the first polysilicon layer;
forming the second polysilicon layer on the third insulating layer comprises:
depositing a second amorphous silicon thin film on the third insulating layer, crystallizing the second amorphous silicon thin film, and processing the crystallized second amorphous silicon thin film through a patterning process to form a second polysilicon thin film, wherein the second polysilicon thin film comprises a first region, a second region, and a third region which are arranged along the direction parallel to the substrate, and the second region and the third region are respectively located at both sides of the first region;
performing a P-type doping processing on the second region and the third region of the second polysilicon thin film to form the second polysilicon layer;
in a case that the first transistor is a P-type transistor and the second transistor is an N-type transistor,
forming the first polysilicon layer on the first insulating layer comprises:
depositing a first amorphous silicon thin film on the first insulating layer, crystallizing the first amorphous silicon thin film, and processing the crystallized first amorphous silicon thin film through a patterning process to form a first polysilicon thin film, wherein the first polysilicon thin film comprises a first region, a second region, and a third region which are arranged along the direction parallel to the substrate, the second region and the third region are respectively located at both sides of the first region;
performing a P-type doping processing on the second region and the third region of the first polysilicon thin film to form the first polysilicon layer;
forming the second polysilicon layer on the third insulating layer comprises:
depositing a second amorphous silicon thin film on the third insulating layer, crystallizing the second amorphous silicon thin film, and processing the crystallized second amorphous silicon thin film through a patterning process to form a second polysilicon thin film, wherein the second polysilicon thin film comprises a first region, a second region, a third region, a fourth region, and a fifth region which are arranged along the direction parallel to the substrate, the second region and the third region are located at both sides of the first region, the fourth region is located at a side of the second region away from the first region, and the fifth region is located at a side of the third region away from the first region;
performing a threshold voltage doping processing on the second polysilicon thin film;
performing an N-type heavy doping processing on the fourth region and the fifth region of the second polysilicon thin film; and
performing an N-type light doping processing on the second region and the third region of the second polysilicon thin film to form the second polysilicon layer.

18. A driving method for a display substrate, used for driving the display substrate according to claim 1, the method comprising:
providing a control signal to the control signal terminal to provide the signal of the signal input terminal to the signal output terminal.

19. The method according to claim 18, wherein in a case that the signal of the signal input terminal is a high-level signal, providing the control signal to the control signal terminal comprises:

providing a first control signal to the control signal terminal, wherein the first control signal is a low-level signal;

in a case that the signal of the signal input terminal is a low-level signal, providing the control signal to the control signal terminal comprises:

providing a second control signal to the control signal terminal, wherein the second control signal is a high-level signal.

20. The display substrate according to claim 6, wherein an orthographic projection of the first channel region on the substrate coincides with an orthographic projection of the second channel region on the substrate; and the orthographic projection of the first channel region on the substrate is at least partially overlapped with an orthographic projection of the first gate electrode on the substrate.

\* \* \* \* \*